(12) United States Patent
Lee et al.

(10) Patent No.: US 10,991,791 B2
(45) Date of Patent: Apr. 27, 2021

(54) DISPLAY DEVICE

(71) Applicant: Samsung Display Co., Ltd., Yongin-si (KR)

(72) Inventors: Seung Kyu Lee, Yongin-si (KR); Yang Wan Kim, Yongin-si (KR); Sun Ja Kwon, Yongin-si (KR); Byung Sun Kim, Yongin-si (KR); Hyun Ae Park, Yongin-si (KR); Su Jin Lee, Yongin-si (KR); Jae Yong Lee, Yongin-si (KR); Tae Hoon Kwon, Yongin-si (KR); Seung Ji Cha, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/785,962

(22) Filed: Feb. 10, 2020

(65) Prior Publication Data

US 2020/0185485 A1 Jun. 11, 2020

Related U.S. Application Data

(63) Continuation of application No. 15/459,353, filed on Mar. 15, 2017, now Pat. No. 10,559,644.

(30) Foreign Application Priority Data

May 17, 2016 (KR) .......................... 10-2016-0060429

(51) Int. Cl.
*G09G 3/3233* (2016.01)
*G09G 3/3225* (2016.01)
*H01L 27/32* (2006.01)
*H01L 51/52* (2006.01)

(52) U.S. Cl.
CPC ....... *H01L 27/3276* (2013.01); *G09G 3/3225* (2013.01); *G09G 3/3233* (2013.01); *H01L 27/3248* (2013.01); *H01L 27/3262* (2013.01); *H01L 51/5253* (2013.01); *G09G 2300/0408* (2013.01); *G09G 2300/0426* (2013.01)

(Continued)

(58) Field of Classification Search
CPC ............... G09G 3/3225; G09G 3/3233; G09G 2300/0408; G09G 3/3266;
(Continued)

(56) References Cited

U.S. PATENT DOCUMENTS 7,365,714 B2 4/2008 Yoo
2004/0219776 A1 11/2004 Park
(Continued)

FOREIGN PATENT DOCUMENTS

EP 1 503 422 2/2005
EP 2 978 024 1/2016
KR 10-0476368 3/2005

OTHER PUBLICATIONS

European Office Action for the corresponding European Application No. 17 171 411.6 dated May 15, 2019.
(Continued)

*Primary Examiner* — Robert J Michaud
(74) *Attorney, Agent, or Firm* — Kile Park Reed & Houtteman PLLC

(57) ABSTRACT

A display device includes a substrate having a pixel area with at least a first rounded corner portion and first to third non-pixel areas arranged sequentially along an outer circumference of the pixel area. An internal circuit in the first non-pixel area has a first end portion adjacent to the first rounded corner portion of the pixel area. The first end portion of the internal circuit is rounded in accordance with the first rounded corner portion. A plurality of routing wires are in the third non-pixel area below the pixel area. The routing wires extending to the pixel area via the second non-pixel area and the first non-pixel area. The routing wires include at least a first routing wire connected to the pixel area passing an area of the first end portion of the internal circuit.

15 Claims, 16 Drawing Sheets

(52) U.S. Cl.
CPC ........... *G09G 2300/0439* (2013.01); *G09G 2300/0819* (2013.01); *G09G 2300/0861* (2013.01); *G09G 2310/0251* (2013.01); *G09G 2310/0262* (2013.01); *G09G 2320/0223* (2013.01); *G09G 2330/021* (2013.01); *G09G 2330/04* (2013.01)

(58) Field of Classification Search
CPC ... G09G 2310/0202; G09G 2310/0232; G09G 2310/0243; G09G 3/325; H01L 27/3276; H01L 27/3248; H01L 27/3262; G06F 1/163; G06F 3/147
See application file for complete search history.

(56) References Cited

U.S. PATENT DOCUMENTS

| | | | |
|---|---|---|---|
| 2008/0048934 A1 | 2/2008 | Yamamoto et al. | |
| 2012/0242222 A1* | 9/2012 | Jung | H01L 51/5253 313/512 |
| 2014/0253419 A1 | 9/2014 | Tanada | |
| 2015/0294985 A1 | 10/2015 | Hekstra | |
| 2016/0005346 A1 | 1/2016 | Kim | |
| 2016/0027380 A1* | 1/2016 | Kim | H01L 27/3276 315/172 |
| 2016/0351107 A1 | 12/2016 | Chen et al. | |

OTHER PUBLICATIONS

Extended European Search Report was issued from the European Patent Office dated Nov. 2, 2017 with respect to the European Patent Application No. 17171411.6.

Extended European Search Report was issued from the European Patent Office dated Jul. 21, 2017 with respect to the European Patent Application No. 17171411.6.

* cited by examiner

FIG. 7
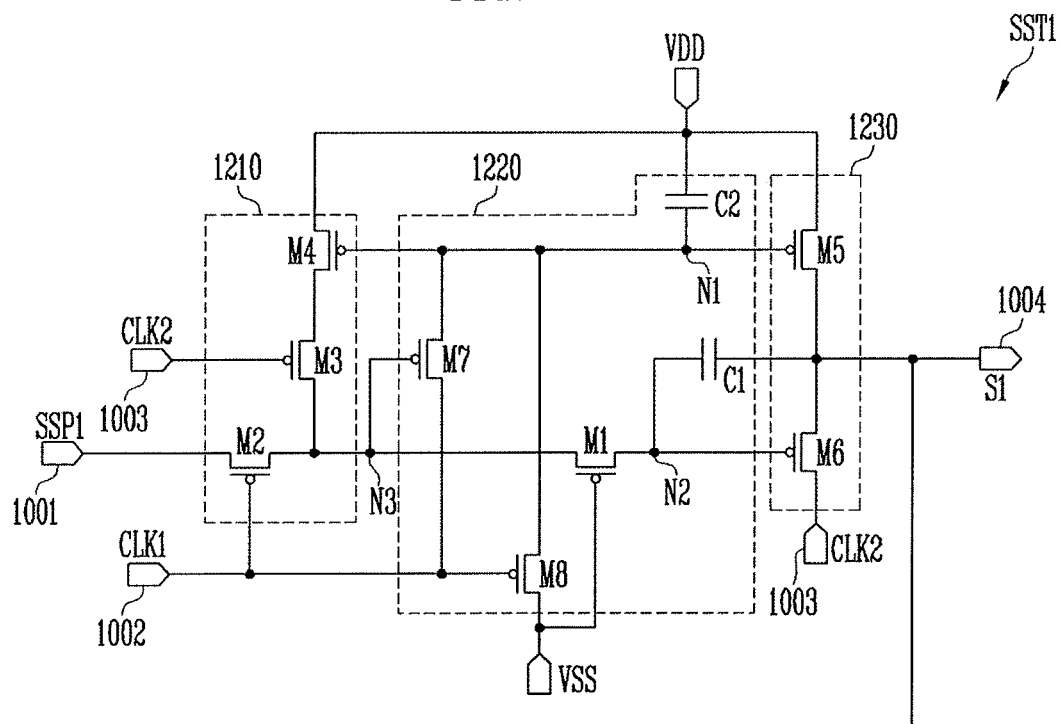
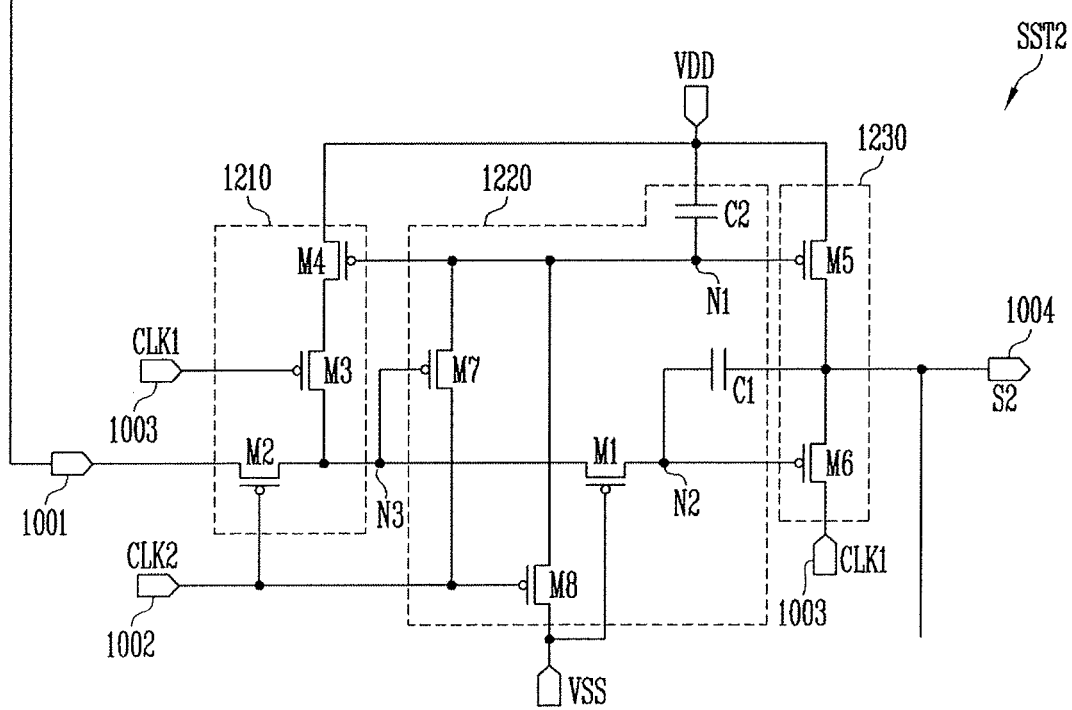

DISPLAY DEVICE

CROSS-REFERENCE TO RELATED APPLICATION

This is a continuation application based on currently pending U.S. patent application Ser. No. 15/459,353, filed on Mar. 15, 2017, the disclosure of which is incorporated herein by reference in its entirety. U.S. patent application Ser. No. 15/459,353 claims priority benefit of Korean Patent Application No. 10-2016-0060429, filed on May 17, 2016 in the Korean Intellectual Property Office and entitled, "Display Device," the disclosure of which is incorporated herein by reference in its entirety for all purposes.

BACKGROUND

1. Field

One or more embodiments described herein relate to a display device.

2. Description of the Related Art

Various types of display devices have been developed. One type of display device includes non-pixel area that surrounds a pixel area. The non-pixel area has a driving circuit or wires for supplying power source voltages or driving signals to pixels in the pixel area. The non-pixel area may also include a material for sealing at least the pixel area or a bonding area of an encapsulating layer. The size of the non-pixel area may restrict the size of the screen in the pixel area.

SUMMARY

In accordance with one or more embodiments, a display device includes a substrate including a pixel area with at least a first rounded corner portion and first to third non-pixel areas arranged sequentially along an outer circumference of the pixel area; a plurality of pixels in the pixel area; an internal circuit in the first non-pixel area and having a first end portion adjacent to the first rounded corner portion of the pixel area, the first end portion of the internal circuit rounded in accordance with the first rounded corner portion; and a plurality of routing wires in the third non-pixel area below the pixel area, the routing wires extending to the pixel area via the second non-pixel area and the first non-pixel area, the routing wires including at least a first routing wire connected to the pixel area passing an area of the first end portion of the internal circuit.

The display device may include an encapsulating layer to cover the pixels and the internal circuit, wherein the encapsulating layer includes a first encapsulating layer that covers the pixel area and the first non-pixel area and a second encapsulating layer that covers the first encapsulating layer and having an end portion in the second non-pixel area. The second encapsulating layer may be superimposed on at least the first routing wire on outskirts of the first end portion of the internal circuit.

The internal circuit may include a plurality of stages to sequentially output a control signal. The first routing wire may traverse an area between adjacent ones of the stages and may be connected to the pixels in a first column. The display device may include at least one power source wire on outskirts of the internal circuit. At least one area of the power source wire may be superimposed on the internal circuit. At least one area of the power source wire may be superimposed on the first end portion of the internal circuit.

The internal circuit may include a transistor and the power source wire may include a first conductive layer on a same layer as one electrode of the transistor and a second conductive layer on and electrically connected to the first conductive layer, with one or more insulating layers therebetween. The first conductive layer may be on a same layer as an electrode on an uppermost layer of electrodes of the transistor. The first conductive layer may only be on another area excluding the area superimposed with the internal circuit.

At least one area of the second conductive layer may be superimposed with the first end portion of the internal circuit. A width of the area of the second conductive layer may be superimposed with the first end portion is greater than a width of the rest of the area. The power source wire may branch into at least a first sub power source line and a second sub power source line in an area adjacent to the first end portion of the internal circuit, and the first end portion may be between the first and second sub power source lines.

The first sub power source line may neighbor an outer circumference of the first end portion, and the second sub power source line may neighbor an inner circumference of the first end portion. The power source wire may include a connecting line connecting the first sub power source line and the second sub power source line. The connecting line may traverse an area between a plurality of stages in the internal circuit and may electrically connect the first sub power source line and the second sub power source line.

The connecting line may include a conductive layer on a different layer from a transistor in the internal circuit portion. A sum of widths of the first and second sub power source lines in an area where the first and second sub power source lines face each other, with the first end portion therebetween, may have a width substantially equal to the power source wire in a non-branch area.

In accordance with one or more embodiments, a display device includes a substrate, a plurality of pixels, a driving circuit and at least one power source wire. The substrate includes a pixel area and a non-pixel area. The plurality of pixels are in the pixel area. At least one of the pixels comprises a transistor on the substrate, a first electrode on a first layer on the transistor, a light emission layer on the first electrode and a second electrode on the light emission layer. The transistor has a semiconductor layer, a gate electrode, and source and drain electrodes. The driving circuit is provided in the non-pixel area and configure to drive the pixels. The at least one power source wire is in the non-pixel area, at least a portion of the power source wire is provided between the driving circuit and an edge portion of the display device. The power source wire comprises a first wire on a second layer and a second wire on the first wire and electrically connected to the first wire. The second wire is provided on a third layer between the first layer and the second layer.

The power source wire may overlap the driving circuit. The power source wire may be electrically connected to the second electrode.

BRIEF DESCRIPTION OF THE DRAWINGS

Features will become apparent to those of skill in the art by describing in detail exemplary embodiments with reference to the attached drawings in which:

FIG. 7 illustrates an embodiment of a scan stage;

DETAILED DESCRIPTION

Figure 1:
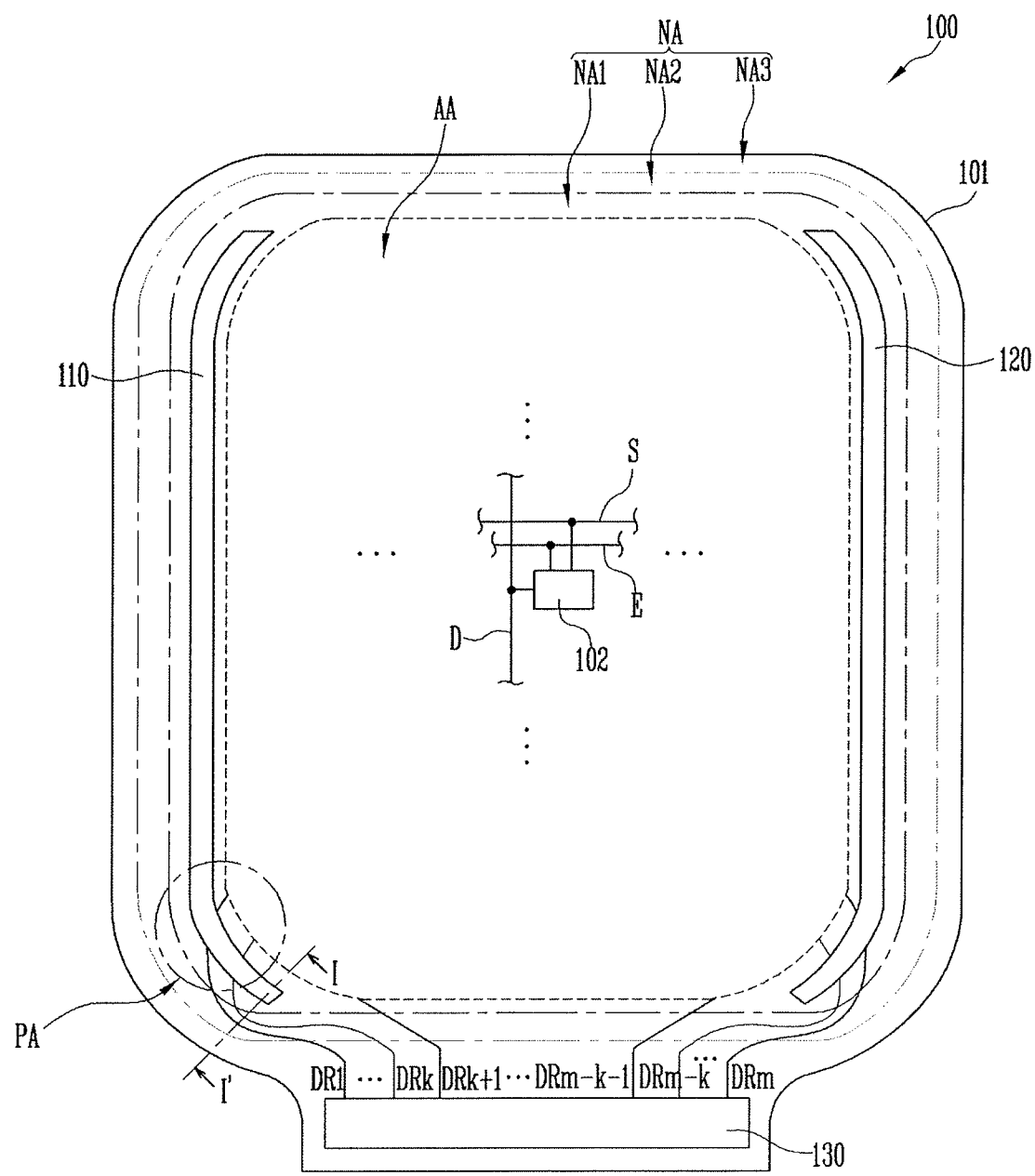
FIG. 1 illustrates an embodiment of a display device.

Example embodiments will now be described with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It should be understood that, when it is described that an element is "coupled" or "connected" to another element, the element may be directly coupled or directly connected to the other element or coupled or connected to the other element through a third element. On the contrary, it should be understood that when an element is referred to as being "directly connected to" or "directly coupled to" another element, another element does not intervene therebetween. Other expressions which describe the relationship between components, that is, "between" and "directly between", or "adjacent to" and "directly adjacent to" need to be interpreted by the same manner. Furthermore, description on portions irrelevant to the present disclosure has been omitted from the drawings to clearly explain the present disclosure, and some of the configurative elements may be exaggerated in size in the illustrations in the drawings. Throughout the entirety of the specification, like reference numerals indicate like configurative elements.

Figure 2:
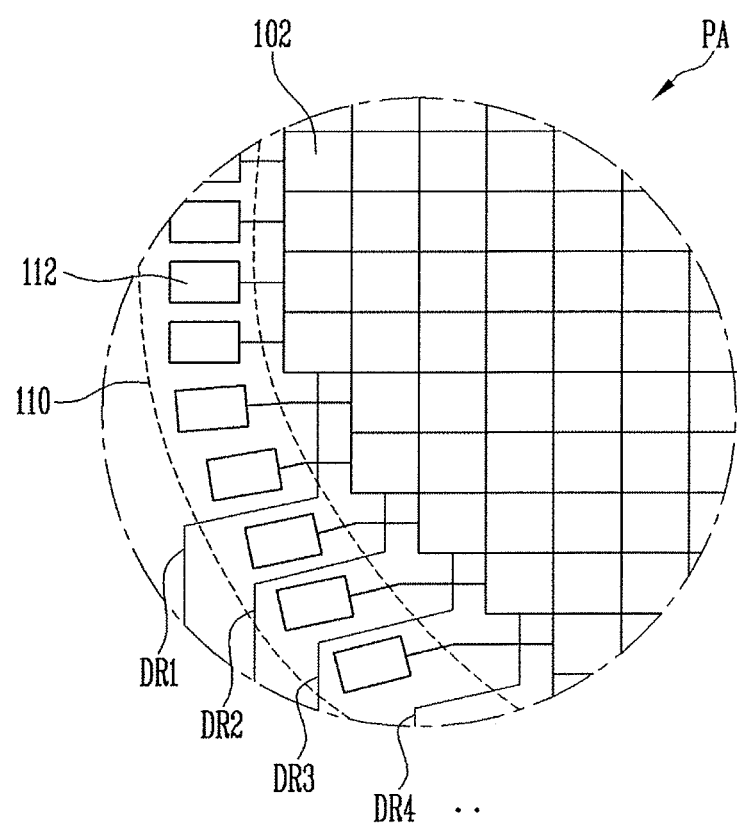
FIG. 2 illustrates an enlarged view of one area of the display device.

FIG. 1 illustrates an embodiment of a display device 100. FIG. 2 is an enlarged view of an area PA of the display device 100. The display device 100 includes a substrate 101 including a pixel area AA and a non-pixel area NA surrounding the pixel area AA, a plurality of pixels 102 in the pixel area AA, and driving circuits 110, 120, 130 in the non-pixel area NA on the substrate 101. According to an embodiment, at least one of the driving circuits 110, 120, 130 may constitute an internal circuit portion. For example, a first driving circuit 110 may constitute a first internal circuit portion and a second driving circuit 120 may constitute a second internal circuit portion.

The substrate 101 may be made of various insulating materials such as glass or resin and the like. Furthermore, the substrate 101 may be embodied as a rigid substrate that does not bend easily or a flexible substrate that may bend or be readily folded. The substrate 101 includes the pixel area AA and the non-pixel area NA. The substrate 101 may be embodied to have a corner portion at a predetermined angle (e.g., 90°) or which is rounded. In one embodiment, four corner portions of the substrate 101 may be rounded to have a curve form. When the corner portion or an end portion is described as being rounded, the corner portion or the end portion may have, for example, a curved, trimmed, diagonal, or step form or a combination of these.

The pixel area AA includes a plurality of scan lines S and data lines D and a plurality of pixels 102 connected to the scan lines S and data lines D. Depending on embodiments, control lines such as light emission control lines E may be arranged in the pixel area AA. In this case, each pixel 102 is connected to the scan line S and the light emission control line E arranged in its corresponding row and to the data line D arranged in its corresponding column. Depending on embodiments, a row and a column may be switched. For example, the scan line S and the light emission control line E may extend in the column direction while the data line D extend in the row direction. Furthermore, a line and a row may be construed oppositely according to the arrangement direction of the display device 100.

Depending on embodiments, at least one corner portion of the pixel area AA may be rounded. For example, all four corner portions of the pixel area AA may be rounded.

The non-pixel area NA includes a first non-pixel area NA1, a second non-pixel area NA2, and a third non-pixel area NA3 sequentially arranged along an outer circumference of the pixel area AA. In the first non-pixel area NA1, the internal circuit portions 110, 120 sealed together with the pixels 102 of the pixel area AA may be arranged. For example, in the first non-pixel area NA1 at both sides of the pixel area AA, a first internal circuit portion 110 and a second internal circuit portion 120 may be arranged, respectively. Depending on embodiments, any one of the first internal circuit portion 110 and the second internal circuit portion 120 may be omitted. The first internal circuit portion 110 or the second internal circuit portion 120 may be arranged only at one side of the pixel area AA.

The first internal circuit portion 110 and the second internal circuit portion 120 may include at least one of a scan driver and a light emission control driver, respectively. For example, the first internal circuit portion 110 may be the scan driver and the second internal circuit portion 120 may be the light emission control driver. Also, any one of the first internal circuit portion 110 or the second internal circuit portion 120 may include both the scan driver and the light emission control driver.

Depending on embodiments, when at least one corner portion of the pixel area AA is rounded, an end portion of the first internal circuit portion 110 and the second internal circuit portion 120 may also be rounded along the shape of the corner portion. For example, when at least one corner portion of the pixel area AA is rounded, a first end portion of the first and/or second internal circuit portion 110, 120 adjacent to the corner portion may also be rounded along the shape of the first corner portion.

The second non-pixel area NA2 may include a bonding portion of an encapsulating layer.

The third non-pixel area NA3 is at an outermost area of the substrate 101 and includes a data driver 130. Depending on embodiments, the data driver 130 may be mounted onto a circuit board or the like outside the substrate 101 and may be connected with the substrate 101 by a pad portion.

A plurality of routing wires DR may be arranged between the data driver 130 and the pixel area AA. The routing wires DR may be, for example, data routing wires. The routing wires DR may be electrically connected to the data lines D in the pixel area AA. Depending on embodiments, the routing wires DR may be integrally formed with the data lines D.

The routing wires DR may be connected to the pixel area AA from the third non-pixel area NA3 adjacent to a lower end of the pixel area AA via the second non-pixel area NA2 and the first non-pixel area NA1 sequentially. For example, the routing wires DR may be in the third non-pixel area NA3 below the pixel area AA and extended to the pixel area AA via the second non-pixel area NA2 and the first non-pixel area NA1. Depending on embodiments, an upper end and a lower end of the pixel area AA may be opposite to each other. For example, when the display device 100 is rotated by 180°, the routing wires DR and the data driver 130 may be seen as being arranged on the upper end of the pixel area AA.

Depending on embodiments, at least one of the routing wires DR starts from the third non-pixel area NA3, passes the area where the rounded end portion of the first and/or second internal circuit portion 110, 120 is rounded, and is then connected to the pixel area AA.

For example, in addition to at least a left end corner portion (e.g., a first corner portion) of the pixel area AA being rounded, when a lower end portion (e.g., a first end portion) of the first internal circuit portion 110 adjacent to the first corner portion is rounded, one or more routing wires DR (for example, first to kth routing wires DR1 to DRk), that includes the first routing wire DR1 connected and/or extended from the third non-pixel area NA3 near a lower end (or a lower edge portion) of the pixel area AA to the first corner portion of the pixel area AA, may go through an area where the first end portion of the first internal circuit portion 110 is arranged and be extended to the pixel area AA.

For this purpose, one or more routing wires DR including the first routing wire DR1 may go through from the third non-pixel area NA3 under a lower end of the pixel area AA to a portion of the second non-pixel area NA2 adjacent to the outskirts of the first end portion of the first internal circuit portion 110. The one or more routing wires DR may then enter or be extended to the first non-pixel area NA1 and pass a portion of the area (e.g. first end portion) of the first internal circuit portion 110 and then extended to the pixel area AA.

Depending on embodiments, in addition to a right end corner portion (e.g., a second corner portion) of the pixel area AA being rounded, when a lower end portion (e.g., a second end portion) of the second internal circuit portion 120 adjacent to the second corner portion is rounded, other ones of the routing wires DR connected and/or extended to a right lower end of the pixel area AA, for example, m-kth to mth routing wires DRm-k to DRm, may go from the third non-pixel area NA3 to an area where the second end portion of the second internal circuit portion 120 is arranged and then extended to the pixel area AA.

A circuit element or wire may be designed such that when at least one of the routing wires DR go through the first and/or second internal circuit portion 110, 120, short defects therebetween may be prevented. For example, when the first routing wire DR1 is superimposed on the first internal circuit portion 110, the first routing wire DR1 may be designed such that a conductive layer constituting the first routing wire DR1, in the area superimposed on the first internal circuit portion 110, may be on a layer different from a layer where a circuit element in the first internal circuit portion 110 is formed, while having at least one insulating layer therebetween.

Otherwise, as illustrated in FIG. 2, for example, assuming that the first to third routing wires DR1, DR2, DR3 pass the area where the first internal circuit portion 110 is arranged, each of the first to third routing wires DR1, DR2, DR3 may be arranged to traverse areas between stages 112 of the first internal circuit portion 110. For example, the first internal circuit portion 110 may include a plurality of stages 112 that output a control signal (e.g., a scan signal or a light emission control signal) sequentially. The first routing wire DR1 may traverse the areas between two adjacent stages 112 from among the stages 112 and be electrically connected to the pixel 102 in a first column.

The display device 100 of the present embodiment may be compared to a comparative example where in a rounded corner portion of the pixel area AA, routing wires DR are arranged between the first and/or second internal circuit portion 110, 120 such that they are not superimposed on the first and/or second internal circuit portion 110, 120. The space of the non-pixel area NA may therefore be utilized efficiently.

Furthermore, according to the display device 100 of the present embodiment, by arranging the routing wires DR on the outskirts of the first and/or second internal circuit portion 110, 120 and superimposed on the bonding area of the encapsulating layer, it is possible to increase or maximize space utilization and reduce the amount of dead space.

Figure 3:
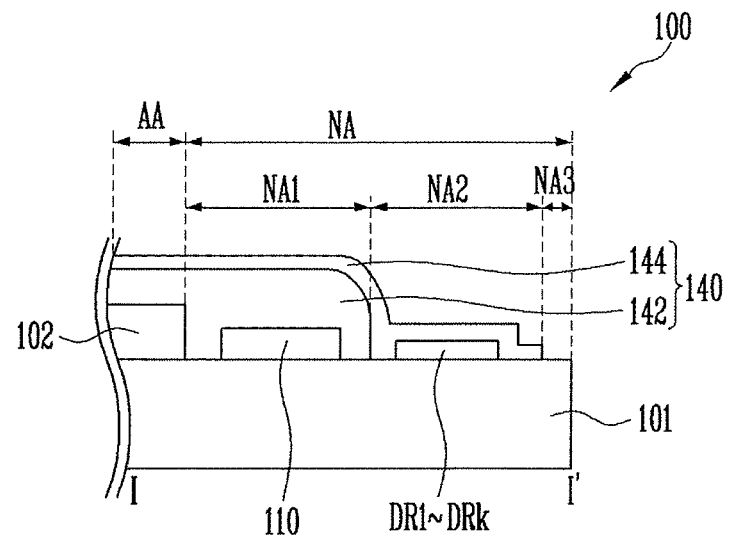
FIG. 3 illustrates a view taken along section line I-I' in FIG. 1.
Figure 4:
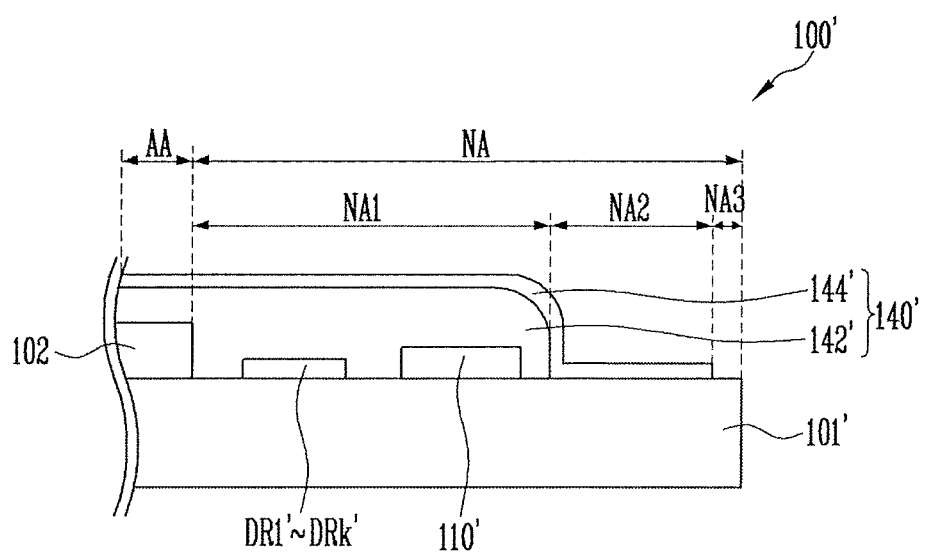
FIG. 4 illustrates a comparative example.

FIG. 3 illustrates a cross-section taken along line I-I' in FIG. 1 according to one embodiment. FIG. 4 illustrates an example of a cross-section of a comparative example of a display device 100'. In FIGS. 3 and 4, an encapsulating layer for sealing at least the pixel area is illustrated.

Referring to FIGS. 3 and 4, areas on the substrate 101 and a substrate 101' are defined as the pixel area AA, the first non-pixel area NA1, the second non-pixel area NA2, and the third non-pixel area NA3 in sequential order from the inside to the outside. At least the pixel area AA and the first non-pixel area NA1 are sealed by the encapsulating layer 140. The encapsulating layer 140 is bonded to the substrate 101 in the second non-pixel area NA2. The third non-pixel area NA3 is an outskirt area of the encapsulating layer 140 and may be an outermost area of the substrate 101.

Depending on embodiments, the encapsulating layer 140 may be formed on the substrate 101 to cover the first and/or second internal circuit portion 110, 120.

The sealing layer 140 includes a first encapsulating layer 142 in the sealing area, e.g., the pixel area AA and the first non-pixel area NA1, and a second encapsulating layer 144 that covers both an upper portion and a side surface of the first encapsulating layer 142 and having an edge area bonded to the substrate 101 in the second non-pixel area NA2.

The first encapsulating layer 142 may include at least one organic film and/or inorganic film to effectively protect at least the circuit element in the pixel area AA from damage from the external environment. For example, the first encapsulating layer 142 may include a single-layer structure of a single organic film or inorganic film. The first encapsulating layer 142 may include a multilayered structure of a plurality of organic films and/or inorganic films. For example, the first encapsulating layer 142 may include a plurality of organic films, a plurality of inorganic films, or a multi-layered structure including at least one of each of the organic film and inorganic film. Otherwise, the first encapsulating layer 142 may include at least one organic, inorganic complex film.

The second encapsulating layer 144 is on an upper portion of the first encapsulating layer 142. The second encapsulating layer 144 includes one or more inorganic films. For example, the second encapsulating layer 144 may include a stacked structure of an inorganic film in the first encapsulating layer 142 and an inorganic film on the upper portion of the first encapsulating layer 142. Such a second encapsulating layer 144 covers both the upper portion and side surface of the organic film in the first encapsulating layer 142 and prevents moisture from penetrating into the sealing area.

In one embodiment, one ore more routing wires DR (e.g., first to $k^{th}$ routing wires DR1 to DRk) are superimposed on the second encapsulating layer 142 in the second non-pixel area NA2, arranged on the outskirts of the first end portion of the first internal circuit portion 110. As an example, FIG. 3 illustrates the first to $k^{th}$ routing wires DR1 to DRk as one block, but the first to kth routing wires DR1 to DRk may actually be configured as a plurality of wires that are separated from each other in one embodiment.

Accordingly, it is possible to superimpose at least a portion of the routing area where the routing wires DR are arranged and the bonding area of the encapsulating layer 140 (that is, the second non-pixel area NA2), thereby efficiently utilizing the space of the non-pixel area NA.

On the other hand, in the case of the display device 100' of the comparative example in FIG. 4, in the area corresponding to I-I' area of FIG. 1, the first to kth routing wires DR1' to DRk' are not routed by the outer side of the first internal circuit portion 110', but are routed directly between the pixel area AA and the first internal circuit portion 110'. This causes the first non-pixel area NA1 to have a greater width. Furthermore, since the second encapsulating layer 144' is bonded to the substrate 101 to cover both the upper portion and side surface of the first encapsulating layer 142', and to thereby protect the sealing area from penetration of moisture, a certain width or more of the second non-pixel area NA2 must be secured for a stable sealing. Therefore, there is a limitation on reducing the width of the second non-pixel area NA2. That is, according to the present embodiment, it is possible to reduce the dead space of the display device 100 through efficient space utilization.

Figure 5:
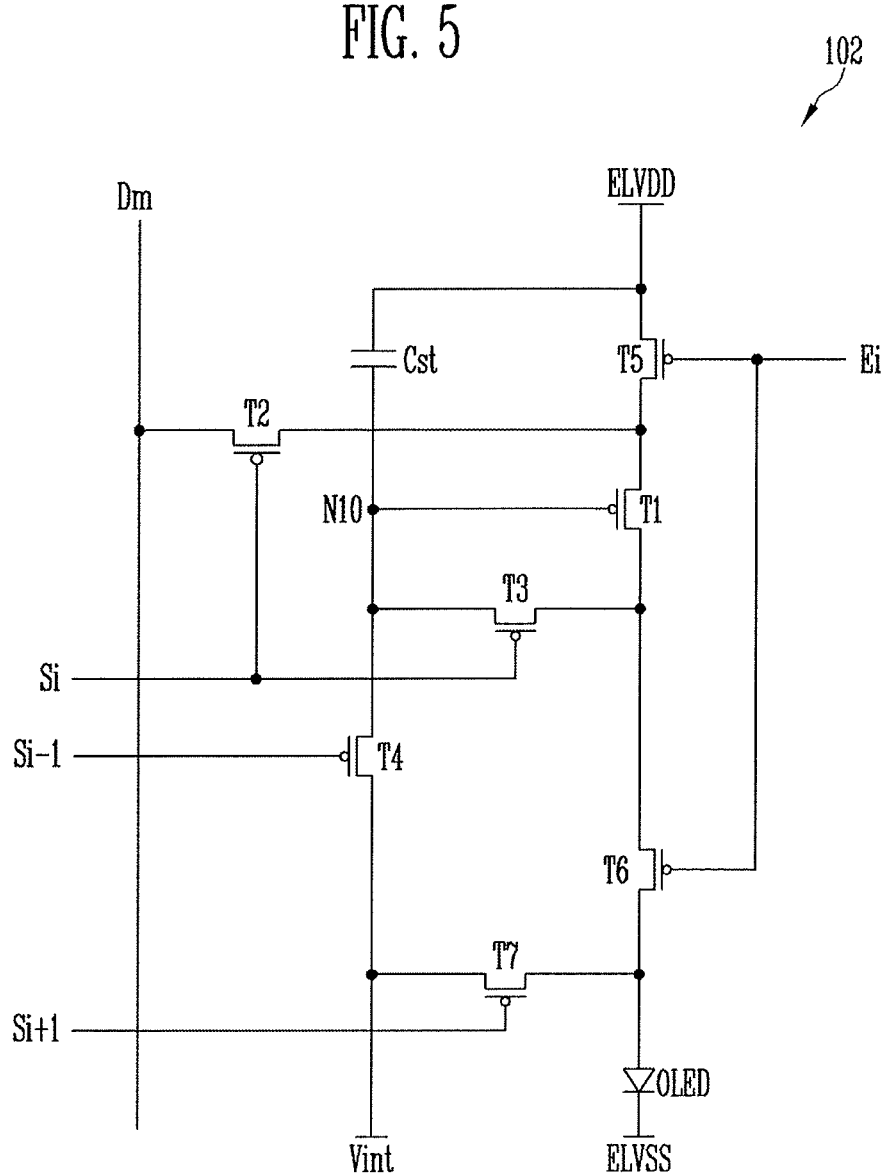
FIG. 5 illustrates an embodiment of a pixel.

FIG. 5 illustrates an embodiment of a pixel 102, which, for example, is connected to an mth data line Dm and an $i^{th}$ scan line Si. Referring to FIG. 5, the pixel 102 includes an organic light emitting diode (OLED), a first transistor T1 to a seventh transistor T7, and a storage capacitor Cst. The pixel may have a different structure in another embodiment.

The organic light emitting diode (OLED) has an anode connected to the first transistor T1 via the sixth transistor T6 and a cathode electrode connected to a second power source (ELVSS). The organic light emitting diode (OLED) generates light of a brightness that corresponds to the amount of a driving current supplied from the first transistor T1. A voltage level of a first power source (ELVDD) may be greater than a voltage level of a second power source (ELVSS), so that current may flow to the organic light emitting diode (OLED). For example, the first power source (ELVDD) may be set as a high potential pixel power source and the second power source (ELVSS) may be set as a low potential pixel power source.

Depending on embodiments, the organic light emitting diode (OLED) may generate any one of various colors of light including red, green, and blue based on the driving current. In one embodiment, the organic light emitting diode (OLED) may generate white light based on the driving current. In this case, a color image may be realized using separate color filters or the like.

The seventh transistor T7 is connected between an initialization power source Vint and the anode electrode of the organic light emitting diode (OLED). A gate electrode of the seventh transistor T7 is connected to an $i+1^{th}$ scan line Si+1. When a scan signal is supplied to the $i+1^{th}$ scan line Si+1, the seventh transistor T7 is turned on and supplies a voltage of the initialization power source Vint to an anode electrode of the organic light emitting diode (OLED). The voltage of the initialization power source (Vint) may be lower than the voltage of the data signal. For example, the voltage of the initialization power source (Vint) may be below a minimum voltage of the data signal.

The sixth transistor T6 is connected between the first transistor T1 and the organic light emitting diode (OLED). The sixth transistor T6 has a gate electrode connected to an $i^{th}$ light emission control line Ei. The sixth transistor T6 is turned off when a light emission control signal is supplied to the $i^{th}$ light emission control line Ei, but otherwise may be turned on.

The fifth transistor T5 is connected between the first power source (ELVDD) and the first transistor T1. The fifth transistor T5 may have a gate electrode connected to the $i^{th}$ light emission control line Ei. The fifth transistor T5 is turned off when the light emission control signal is supplied to the $i^{th}$ light emission control line Ei, but otherwise may be turned on.

The first transistor T1 (a driving transistor) has a first electrode connected to the first power source (ELVDD) via the fifth transistor T5 and a second electrode connected to the anode electrode of the organic light emitting diode (OLED) via the sixth transistor T6. A gate electrode of the first transistor T1 is connected to a tenth node N10. The first transistor T1 controls the amount of current that flows from the first power source (ELVDD) to the second power source (ELVSS), via the organic light emitting diode (OLED), based on the voltage of the tenth node N10.

The third transistor T3 is connected between the second electrode of the first transistor T1 and the tenth node N10. The gate electrode of the third transistor T3 is connected to the $i^{th}$ scan line Si. The third transistor T3 is turned on when a scan signal is supplied to the $i^{th}$ scan line Si and may electrically connect the second electrode of the first transistor T1 and the tenth node N10 of the second electrode. Therefore, when the third transistor T3 is turned on, the first transistor T1 is in a diode-connected state.

The fourth transistor T4 is connected between the tenth node N10 and the initialization power source Vint. The gate electrode of the fourth transistor T4 is connected to the $i-1^{th}$ scan line Si−1. The fourth transistor T4 is turned on when a scan signal is supplied to the $i-1^{th}$ scan line Si−1, and the fourth transistor T4 then supplies the initialization voltage Vint to the tenth node N10.

The second transistor T2 is connected between the $m^{th}$ data line and the first electrode of the first transistor T1. The gate electrode of the second transistor T2 is connected to the $i^{th}$ scan line Si. The second transistor T2 is turned on when the scan signal is supplied to the $i^{th}$ scan line Si, and the second transistor T2 then electrically connects the $m^{th}$ data line Dm and the first electrode of the first transistor T1.

The storage capacitor Cst is connected between the first power source ELVDD and the tenth node N10. The storage capacitor Cst stores a voltage corresponding to the data signal and a threshold voltage of the first transistor T1.

Figure 6:
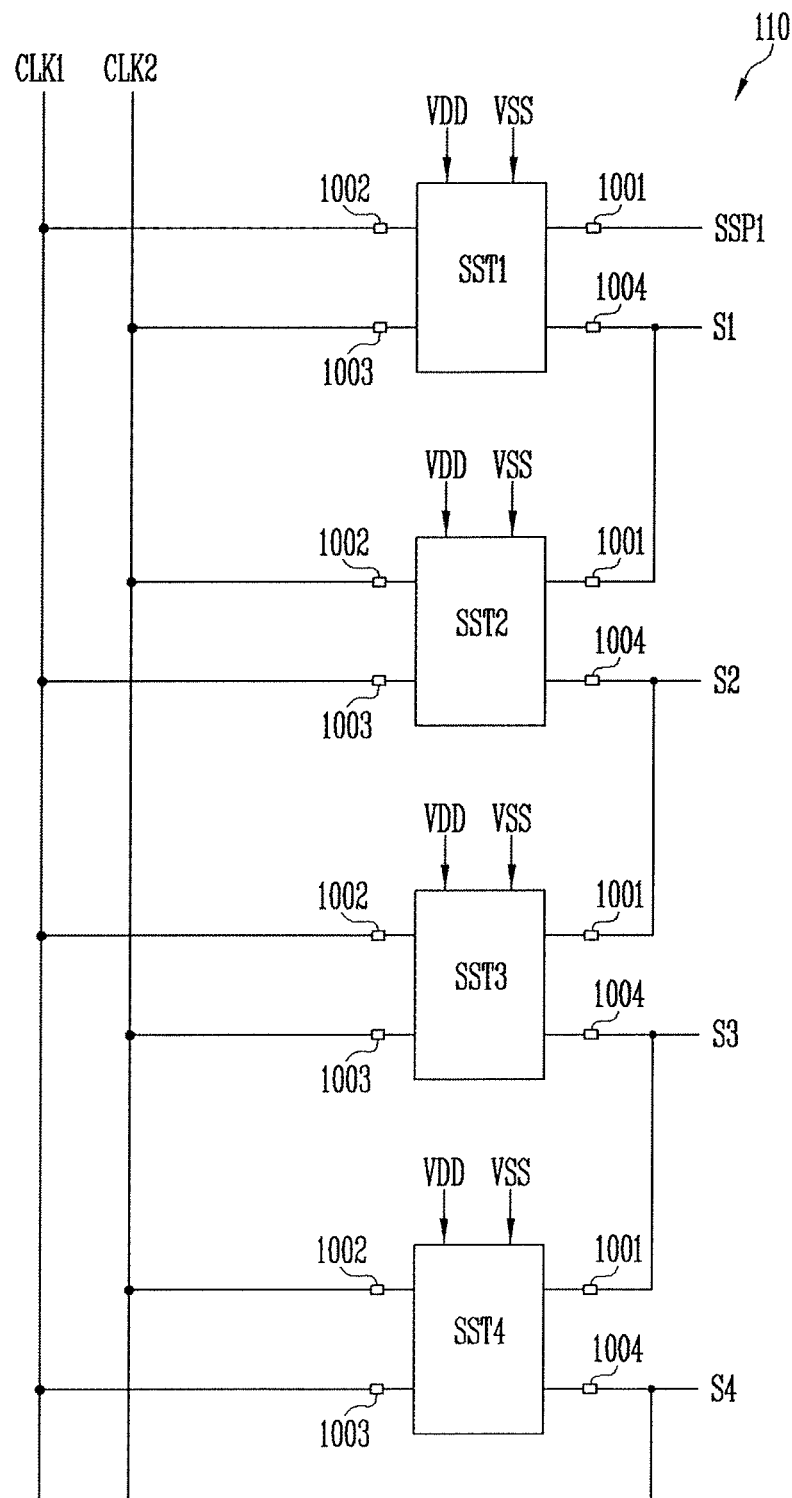
FIG. 6 illustrates an embodiment of a scan driver.

FIG. 6 illustrates an embodiment of a scan driver 110, which, for example, may be inside the first and/or second internal circuit portion. For convenience sake, explanation hereinafter will be made based on an assumption that the first internal circuit portion is configured as the scan driver. The scan driver includes a plurality of scan stages that output a scan signal sequentially.

Referring to FIG. 6, the scan driver 110 with a plurality of scan stages SST1 to SST4. The scan driver may have a different number of scan stages in another embodiment. The scan stages STT1 to SST4 are connected to corresponding scan lines S1 to S4 and are driven based on clock signals CLK1, CLK2. The scan stages SST1 to SST4 may have, for example, the same structure.

Each of the scan stages SST1 to SST4 includes a first input terminal 1001 to a third input terminal 1003 and an output terminal 1004. The first input terminal 1001 of each of the scan stages SST1 to SST4 is supplied with an output signal (e.g., a scan signal) of a previous step scan stage or a first start pulse SSP1. For example, the first input terminal 1001 of the first scan stage SST1 may be supplied with the first start pulse SSP1. The rest of the scan stages SST2 to SST4 may be supplied with an output signal of a previous step stage.

The second input terminal of an a $j^{th}$(j being an odd or even number) scan stage SSTj is supplied with the first clock signal CLK1. The third input terminal 1003 is supplied with the second clock signal CLK2. The second input terminal 1002 of the j+1th scan stage SSTj+1 is supplied with the second clock signal CLK2 and the third input terminal 1003 is supplied with the first clock signal CLK1.

The first clock signal CLK1 and the second clock signal CLK2 may have a same cycle and non-overlapping phases. For example, based on an assumption that a period where a scan signal is supplied to the first scan signal Si is 1 horizontal period 1 H, each of the clock signals CLK1, CLK2 has a cycle of 2 H and the clock signals CLK1, CLK2 may be supplied in different horizontal periods from each other.

Each of the scan stages SST1 to SST4 is supplied with a first driving power source VDD and a second driving power source VSS. The first driving power source VDD may be set to a gate off voltage, for example, a high voltage. The second driving power source VSS may be set to a gate on voltage, for example, a low voltage.

FIG. 7 illustrates an embodiment of a scan stage in FIG. 6. For convenience sake, FIG. 7 illustrates the first scan stage and the second scan stage. The first scan stage SST1 includes a first driver 1210, a second driver 1220, an output circuit 1230 (or buffer), and a first transistor M1. The output circuit 1230 controls the voltage supplied to the output terminal 1004 based on the first node N1 and the second node N2.

For this purpose, the output circuit 1230 includes a fifth transistor M5 and a sixth transistor M6. The fifth transistor M5 is connected between the first driving power source VDD and the output terminal 1004. The gate electrode of the fifth transistor M5 is connected to the first node N1. The fifth transistor M5 controls a connection between the first driving power source VDD and the output terminal 1004 based on the voltage being applied to the first node N1.

The sixth transistor M6 is connected between the output terminal 1004 and the third input terminal 1003. The gate electrode of the sixth transistor M6 is connected to the second node N2. The sixth transistor M6 controls a connection between the output terminal 1004 and the third input terminal 1003 based on the voltage applied to the second node N2. The output circuit 1230 operates as a buffer. Additionally, the fifth transistor M5 and/or the sixth transistor M6 may include a plurality of transistors connected in parallel to one another.

The first driver 1210 controls the voltage of the third node N3 based on signals supplied to the first input terminal 1001 to the third input terminal 1003. For this purpose, the first driver 1210 includes the second transistor M2 to the fourth transistor M4. The second transistor M2 is connected between the first input terminal 1001 and the third node N3. The gate electrode of the second transistor M2 is connected to the second input terminal 1002. The second transistor M2 controls a connection between the first input terminal 1001 and the third node N3 based on the signal supplied to the second input terminal 1002.

The third transistor M3 and the fourth transistor M4 are connected in series between the third node N3 and the first driving power source VDD. The third transistor M3 is connected between the fourth transistor M4 and the third node N3. The gate electrode of the third transistor M3 is connected to the third input terminal 1003. The third transistor M3 controls the connection between the fourth transistor M4 and the third node N3 based on the signal supplied to the third input terminal 1003.

The fourth transistor M4 is connected between the third transistor M3 and the first driving power source VDD. The gate electrode of the fourth transistor M4 is connected to the first node N1. The fourth transistor M4 controls the connection between the third transistor M3 and the first driving power source VDD based on the voltage of the first node N1.

The second driver 1220 controls the voltage of the first node N1 based on the second input terminal 1002 and the voltage of the third node N3. For this purpose, the second driver 1220 includes the seventh transistor M7, the eighth transistor M8, the first capacitor M1, and the second capacitor C2. The first capacitor C1 is connected between the second node N2 and the output terminal 1004. The first capacitor C1 charges a voltage corresponding to a turn-on and turn-off of the sixth transistor M6.

The second capacitor C2 is connected between the first node N1 and the first driving power source VDD. The second capacitor C2 charges a voltage being applied to the first node N1.

The seventh transistor M7 is connected between the first node N1 and the second input terminal 1002. The gate electrode of the seventh transistor M7 is connected to the third node N3. The seventh transistor M7 controls a connection between the first node N1 and the second input terminal 1002 based on the voltage of the third node N3.

The eighth transistor M8 is connected between the first node N1 and the second driving power source VSS. The gate electrode of the eighth transistor M8 is connected to the second input terminal 1002. The eighth transistor M8 controls the connection between the first node N1 and the second driving power source VSS based on the signal of the second input terminal 1002.

The first transistor M1 is connected between the third node N3 and the second node N2. The gate electrode of the first transistor M1 is connected to the second driving power source VSS. Such a first transistor M1 maintains the electrical connection between the third node N3 and the second node N2 while maintaining its turn-on state. Additionally, the first transistor M1 restricts the degree of decrease of the voltage of the third node N3 based on the voltage of the second node N2. For example, even if the voltage of the second node N2 decreases to a lower voltage than the second driving power source VSS, the voltage of the third node N3 does not fall below the threshold voltage of the first transistor M1 subtracted from the second driving power source VSS.

Figure 8:
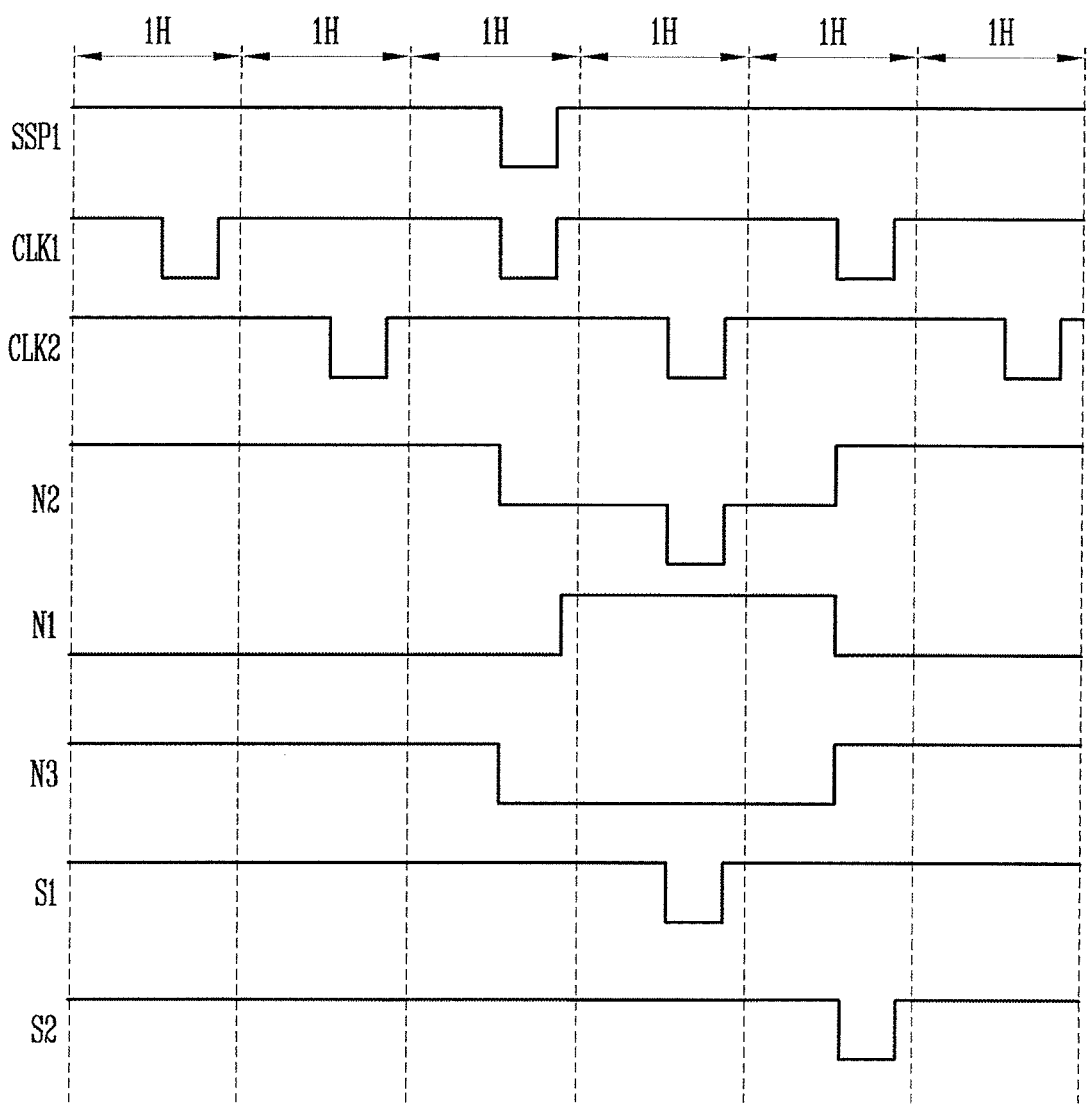
FIG. 8 illustrates an embodiment of a method for driving the scan stage.

FIG. 8 illustrates an embodiment of a method for driving the scan stage in FIG. 7. For convenience sake, an operation process will be explained using the first scan stage SST1 with reference to FIG. 8.

Referring to FIG. 8, the first clock signal CLK1 and the second clock signal CLK2 have a two (2) horizontal period (2 H) cycle and may be supplied in different horizontal periods from each other. For example, the second clock signal CLK2 is set as a signal shifted by as much as a half cycle (e.g., 1 horizontal period) from the first clock signal CLK1. The first start pulse SSP1 supplied to the first input terminal 1001 is synchronized with the clock signal supplied to the second input terminal 1002, e.g., the first clock signal CLK1.

When the first start pulse SSP1 is supplied, the first input terminal 1001 may be set to the voltage of the second driving power source VSS. When the first start pulse SSP1 is not supplied, the first input terminal 1001 may be set to the voltage of the first driving power source VDD. Furthermore, when the clock signal CLK is supplied to the second input terminal 1002 and the third input terminal 1003, the second input terminal 1002 and the third input terminal 1003 may be set to the voltage of the second driving power source VSS. When the clock signal CLK is not supplied to the second input terminal 1002 and the third input terminal 1003, the second input terminal 1002 and the third input terminal 1003 may be set to the voltage of first driving power source VDD.

For example, first of all, the first start pulse SSP1 is supplied to be synchronized with the first clock signal CLK1. When the first clock signal CLK1 is supplied, the second transistor M2 and the eighth transistor M8 are turned on. When the second transistor M2 is turned on, the first input terminal 1001 and the third node N3 are electrically connected. Since the first transistor M1 is always set to a turn-on state, the second node N2 maintains its electrical connection with the third node N3.

When the first input terminal 1001 and the third node N3 are electrically connected, the voltage of the third node N3 and the second node N2 are set to a low voltage by the first start pulse SSP supplied to the first input terminal 1001. When the voltage of the third node N3 and the second node N2 are set to a low voltage, the sixth transistor M6 and the seventh transistor M7 are turned on.

When the sixth transistor M6 is turned on, the third input terminal 1003 and the output terminal 1004 are electrically connected. The third input terminal 1003 is set to a high voltage, e.g., the second clock signal CLK2 is not supplied. Accordingly, a high voltage is output to the output terminal 1004. When the seventh transistor M7 is turned on, the second input terminal 1002 and the first node N1 are electrically connected. Then, the voltage of the first clock signal CLK1 is supplied to the second input terminal 1002, e.g., the low voltage is supplied to the first node N1.

When the first clock signal CLK1 is supplied, the eighth transistor M8 is turned on. When the eighth transistor M8 is turned on, the voltage of the second driving power source VSS is supplied to the first node N1. The voltage of the second driving power source VSS is set to a same (or similar) voltage as that of the first clock signal CLK1. Accordingly, the first node N1 stably maintains the low voltage.

When the first node N1 is set to the low voltage, the fourth transistor M4 and the fifth transistor M5 are turned on. When the fourth transistor M4 is turned on, the first driving power source VDD and the third transistor M3 are electrically connected. Since the third transistor M3 is set to a turned-off state, even when the fourth transistor M4 is turned on, the third node N3 stably maintains the low voltage. When the fifth transistor M5 is turned on, the voltage of the first driving power source VDD is supplied to the output terminal 1004. The voltage of the first driving power source VDD is set to a same voltage as the high voltage supplied to the third input terminal 1003. Accordingly, the output terminal 1004 stably maintains the high voltage.

Thereafter, supply of the first start pulse SSP1 and the first clock signal CLK1 stops. When the supply of the first clock signal CLK1 stops, the second transistor M2 and the eighth transistor M8 are turned off. The sixth transistor M6 and the seventh transistor M7 maintain the turned-on state based on the voltage stored in the first capacitor C1. Thus, the second node N2 and the third node N3 maintain the low voltage based on the voltage stored in the first capacitor C1.

When the sixth transistor M6 maintains the turned-on state, the output terminal 1004 and the third input terminal 1003 maintain their electrical connection. When the seventh transistor M7 maintains the turned-on state, the first node N1 maintains an electrical connection with the second input terminal 1002. The voltage of the second input terminal 1002 is set to a high voltage based on the stop of supply of the first clock signal CLK1. Accordingly, the first node N1 is also set to a high voltage. When the high voltage is supplied to the first node N1, the fourth transistor M4 and the fifth transistor M5 are turned off.

Thereafter, the second clock signal CLK2 is supplied to the third input terminal. Since the sixth transistor M6 is set to a turned-on state, the second clock signal CLK2 supplied to the third input terminal 1003 is supplied to the output terminal 1004. In this case, the output terminal 1004 outputs the second clock signal CLK2 to the first scan line Si as a scan signal.

When the second clock signal CLK2 is supplied to the output terminal 1004, the voltage of the second node N2 decreases to a lower voltage than the second driving power source VSS by a coupling of the first capacitor C1. Accordingly, the sixth transistor M6 stably maintains its turned-on state.

Even if the voltage of the second node N2 decreases, the third node N3 maintains the general voltage (the threshold voltage of the first transistor M1 subtracted from the second driving power source VSS) of the second driving power source VSS by the first transistor M1.

After the scan signal is output to the first scan line S1, the supply of the second clock signal CLK2 stops. When the supply of the second clock signal stops, the output terminal 1004 outputs a high voltage. Furthermore, the voltage of the second node N2 increases to the general voltage of the second driving power source VSS based on the high voltage of the output terminal 1004.

Thereafter, the first clock signal CLK1 is supplied. When the first clock signal CLK1 is supplied, the second transistor M2 and the eighth transistor M8 are turned on. When the second transistor M2 is turned on, the first input terminal 1001 and the third node N3 are electrically connected. The first start pulse SSP1 is not supplied to the first input terminal 1001. Accordingly, the first input terminal 1001 is set to a high voltage. Therefore, when the first transistor M1 is turned on, a high voltage is supplied to the third node N3 and the second node N2. Accordingly, the sixth transistor M6 and the seventh transistor M7 are turned off.

When the eighth transistor M8 is turned on, the second driving power source VSS is supplied to the first node N1. Accordingly, the fourth transistor M4 and the fifth transistor M5 are turned on. When the fifth transistor M5 is turned on, the voltage of the first driving power source VDD is supplied to the output terminal 1004. Thereafter, the fourth transistor M4 and the fifth transistor M5 maintain their turned on stage based on the voltage charged to the second capacitor C2. Accordingly, the output terminal 1004 is stably supplied with the voltage of the first driving power source VDD.

When the second clock signal CLK2 is supplied, the third transistor M3 is turned on. Since the fourth transistor M4 is set to a turned on state, the voltage of the first driving power source VDD is supplied to the third node N3 and the second node N2. In this case, the sixth transistor M6 and the seventh transistor M7 stably maintain their turned off state.

The second scan stage SST2 is supplied with the output signal (e.g., scan signal) of the first scan stage SST1 synchronized with the second clock signal CLK2. In this case, the second scan stage SST2 outputs the scan signal to the second scan line S2 synchronized with the second clock signal CLK2. The scan stages SST according to the present embodiment may repeat the aforementioned process to output the scan signal to the scan lines S sequentially.

In the present embodiment, the first transistor M1 restricts the degree of decrease of the voltage of the third node N3 irrespective of the voltage of the second node N2, thereby securing reliability of fabricating costs and operation.

For example, when the scan signal is supplied to the output terminal 1004, the voltage of the second node N2 decreases to a voltage of about VSS−(VDD−VSS). Assuming that the first driving power source VDD is 7V and the second driving power source VSS is −8V, the voltage of the second node N2 decreases to a voltage of about −20V, even when considering the threshold voltage of the transistors.

When the first transistor M1 is deleted, the source-drain voltage Vds of the second transistor M2 and the source-gate voltage Vgs of the seventh transistor M7 are set to be about −27V. Therefore, components having high pressure-resistance may be used for the second transistor M2 and the seventh transistor M7. Furthermore, when a high voltage is applied to the second transistor M2 and the seventh transistor M7, power consumption may be high. Further, reliability of operation may deteriorate. However, when the first transistor M1 is added between the third node N3 and the second node N2, the voltage of the third node N3 maintains the general voltage of the second power source VSS. Accordingly, the source-drain voltage Vds of the second transistor M2 and the source-gate voltage Vgs of the seventh transistor M7 may be set to about −14V.

Figure 9:
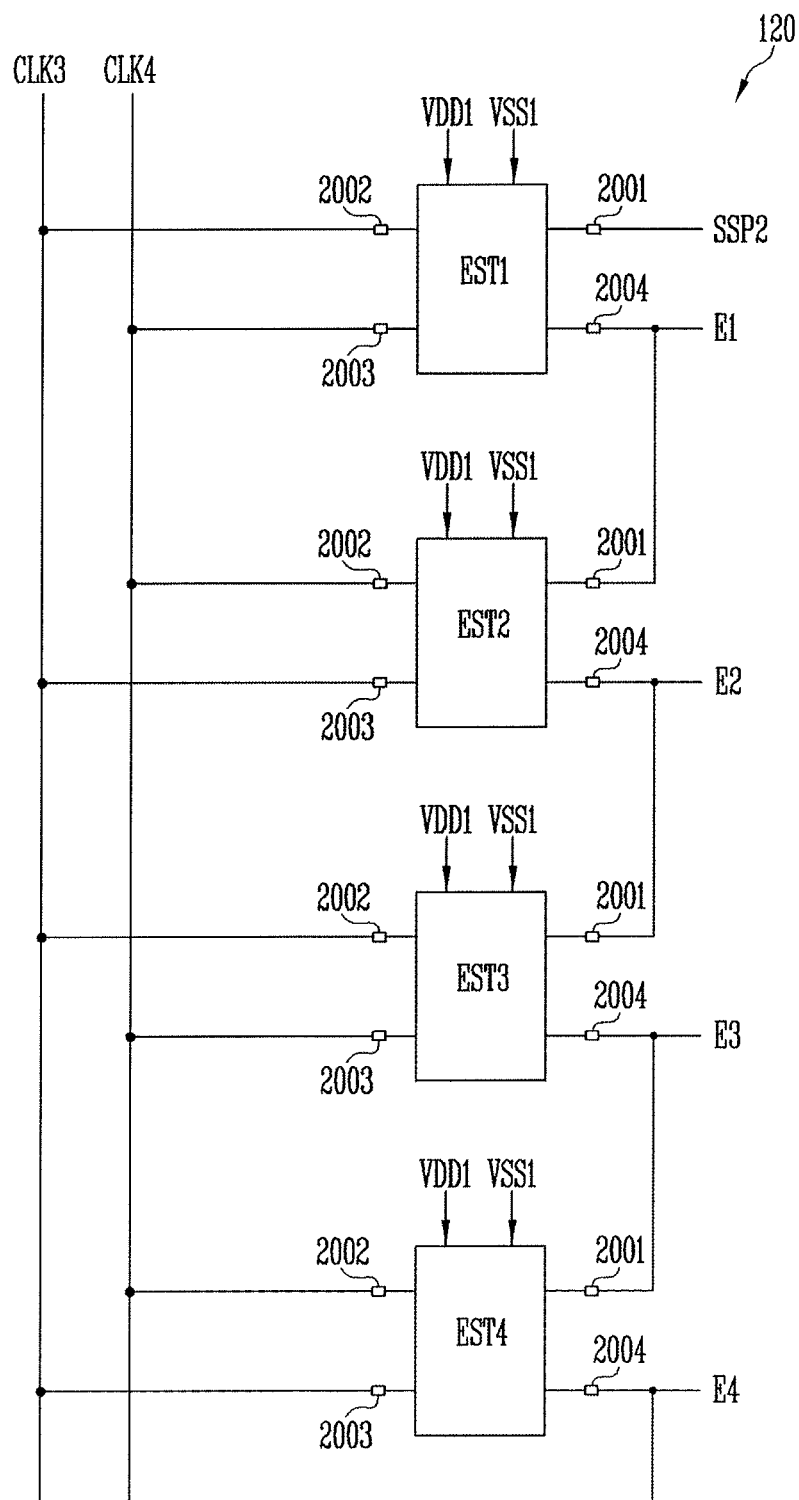
FIG. 9 illustrates an embodiment of a light emission control driver.

FIG. 9 illustrates an embodiment of a light emission control driver 120. The light emission control driver 120 in FIG. 9 may be configured inside the first and/or second internal circuit portion. for convenience sake, the second internal circuit portion may be considered to be a light emission control driver that includes a plurality of light emission control stages that output light emission control signals sequentially.

Referring to FIG. 9, the light emission control driver 120 is provided with a plurality of light emission control stages EST1 to EST4. Each of the light emission control stages EST1 to EST4 is connected to a corresponding one of the light emission control lines E1 to E4. The light emission control stages EST1 to EST4 operate based on clock signals CLK3, CLK4. In one embodiment, the light emission control stages EST1 to EST4 may be in a same circuit. Also, the number of light emission control stages may be different from four in another embodiment.

Each of the light emission control stages EST1 to EST4 includes a first input terminal 2001 to a third input terminal 2003 and an output terminal 2004. The first input terminal 2001 of each of the light emission control stages EST1 to EST4 is supplied with the output signal (e.g., light emission control signal) of a previous step light emission control stage or a second start pulse SSP2. For example, the first input terminal 2001 of the first light emission control stage EST1 is supplied with the second start pulse SSP2. The first input terminal 2001 of the rest of the light emission control stages EST2 to EST4 are supplied with the output signal of the previous step stage.

The second input terminal 2002 of the $j^{th}$ light emission control stage ESTj is supplied with the third clock signal CLK3 and the third input terminal 2003 is supplied with the fourth clock signal CLK4. The second input terminal 2002 of the $j+1^{th}$ light emission control stage ESTj+1 is supplied with the fourth clock signal CLK4, and the third input terminal 2003 is supplied with the third clock signal CLK3.

The third clock signal CLK3 and the fourth clock signal CLK4 may have a same cycle and non-overlapping phases. For example, each clock signal CLK3, CLK4 may have a cycle of 2H and may be supplied in different horizontal periods.

Furthermore, each of the light emission control stages EST1 to EST4 is supplied with third driving power source VDD1 and the fourth driving power source VSS1. The third driving power source VDD1 may be set to a gate off voltage, and the fourth driving power source VSS1 may be set to a gate on voltage. Depending on embodiments, the third driving power source VDD1 may be set to a same voltage as the first driving power source VDD, and the fourth driving power source VSS1 may be set to a same voltage as the second driving power source VSS.

Figure 10:
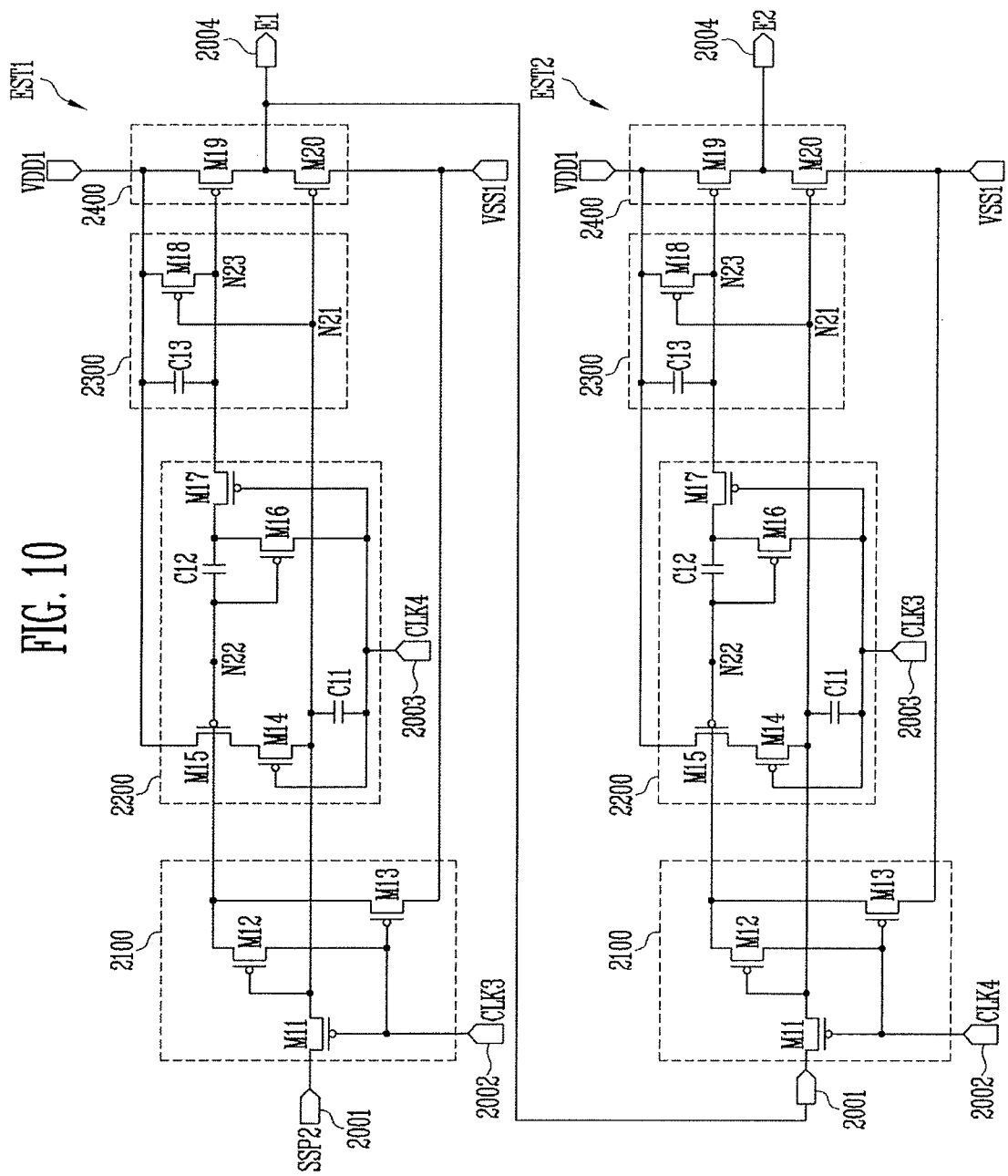
FIG. 10 illustrates an embodiment of a light emission control stage.

FIG. 10 illustrates an embodiment of the light emission control stage EST in FIG. 9. For convenience sake, FIG. 10 illustrates the first light emission control stage EST1 and the second light emission control stage EST2.

Referring to FIG. 10, the first light emission control stage EST1 includes a first signal processor 2100, a second signal processor 2200, a third signal processor 2300, and an output circuit 2400 (or buffer). The first signal processor 2100 controls the voltage of the twenty-second node N22 and the twenty-first node N21 based on the signals supplied to the first input terminal 2001 and the second input terminal 2002.

For this purpose, the first signal processor 2100 includes an eleventh transistor M11 to a thirteenth transistor M13.

The eleventh transistor M11 is connected between the first input terminal 2001 and the twenty-first node N21. The gate electrode of the eleventh transistor M11 is connected to the second input terminal 2002. The eleventh transistor M11 is turned on when the third clock signal CLK3 is supplied to the second input terminal 2002.

The twelfth transistor M12 is connected between the second input terminal 2002 and the twenty-second node N22. The gate electrode of the twelfth transistor M12 is connected to the twenty-first node N21. The twelfth transistor M12 is turned on or turned off in response to the voltage of the twenty-first node N21.

The thirteenth transistor M13 is connected between the fourth driving power source VSS1 and the twenty-second node N22. The gate electrode of the thirteenth transistor M13 is connected to the second input terminal 2002. The thirteenth transistor M13 is turned on when the third clock signal CLK3 is supplied to the second input terminal 2002.

The second signal processor 2200 controls the twenty-first node N21 and the twenty-third node N23 based on the signal supplied to the third input terminal 2003 and the voltage of the twenty-second node N22. For this purpose, the second signal processor 2200 includes the fourteenth transistor M14 to the seventeenth transistor M17, the eleventh capacitor C11, and the twelfth capacitor C12.

The fourteenth transistor M14 is connected between the fifteenth transistor M15 and the twenty-first node N21. The gate electrode of the fourteenth transistor M14 is connected to the third input terminal 2003. The fourteenth transistor M14 is turned on when the fourth clock signal CLK4 is provided to the third input terminal 2003.

The fifteenth transistor M15 is connected between the third driving power source VDD1 and the fourteenth transistor M14. The gate electrode of the fifteenth transistor M15 is connected to the twenty-second node N22. The fifteenth transistor 15 is turned on or turned off based on the voltage of the twenty-second node N22.

The sixteenth transistor M16 is connected between the first electrode of the seventh transistor M17 and the third input terminal. The gate electrode of the sixteenth transistor M16 is connected to the twenty-second node N22. The sixteenth transistor M16 is turned on or turned off based on the voltage of the twenty-second node N22.

The seventeenth transistor M17 is connected between the first electrode of the sixteenth transistor M16 and the twenty-third node N23. The gate electrode of the seventeenth transistor M17 is connected to the third input terminal 2003. The seventeenth transistor M17 is turned on when the fourth clock signal CLK4 is supplied to the third input terminal 2003.

The eleventh capacitor C11 is connected between the twenty-first node N21 and the third input terminal 2003.

The twelfth capacitor C12 is connected between the twenty-second node N22 and the first electrode of the seventeenth transistor M17.

The third signal processor 2003 controls the voltage of the twenty-third node N23 based on the voltage of the twenty-first node N21. For this purpose, the third signal processor 2003 includes the eighteenth transistor M18 and the thirteenth capacitor C13. The eighteenth transistor M18 is connected between the third driving power source VDD1 and the twenty-third node N23. The gate electrode of the eighteenth transistor M18 is turned on or turned off based on the voltage of the twenty-first node N21. The eighteenth transistor M18 is turned on or turned off based on the voltage of the twenty-first node N21.

The thirteenth capacitor C13 is connected between the third driving power source VDD1 and the twenty-third node N23.

The output circuit 2400 controls the voltage supplied to the output terminal 2004 based on the voltage of the twenty-first node N21 and the twenty-third node N23. For this purpose, the output circuit 2400 includes a nineteenth transistor M19 and a twentieth transistor M20. The nineteenth transistor M19 is connected between the third driving power source VDD1 and the output terminal 2004. The gate electrode of the nineteenth transistor M19 is connected to the twenty-third node N23. Such a nineteenth transistor M19 is turned on or turned off based on the voltage of the twenty-third node N23.

The twentieth transistor M20 is connected between the output terminal 2004 and the fourth driving power source VSS1. The gate electrode of the twentieth transistor M20 is connected to the twenty-first node N21. The twentieth transistor M20 is turned on or turned off based on the voltage of the twenty-first node N21. The output circuit 2400 operates as a buffer. Additionally, the nineteenth transistor M19 and/or the twentieth transistor M20 may be configured such that a plurality of transistors are connected in parallel.

Figure 11:
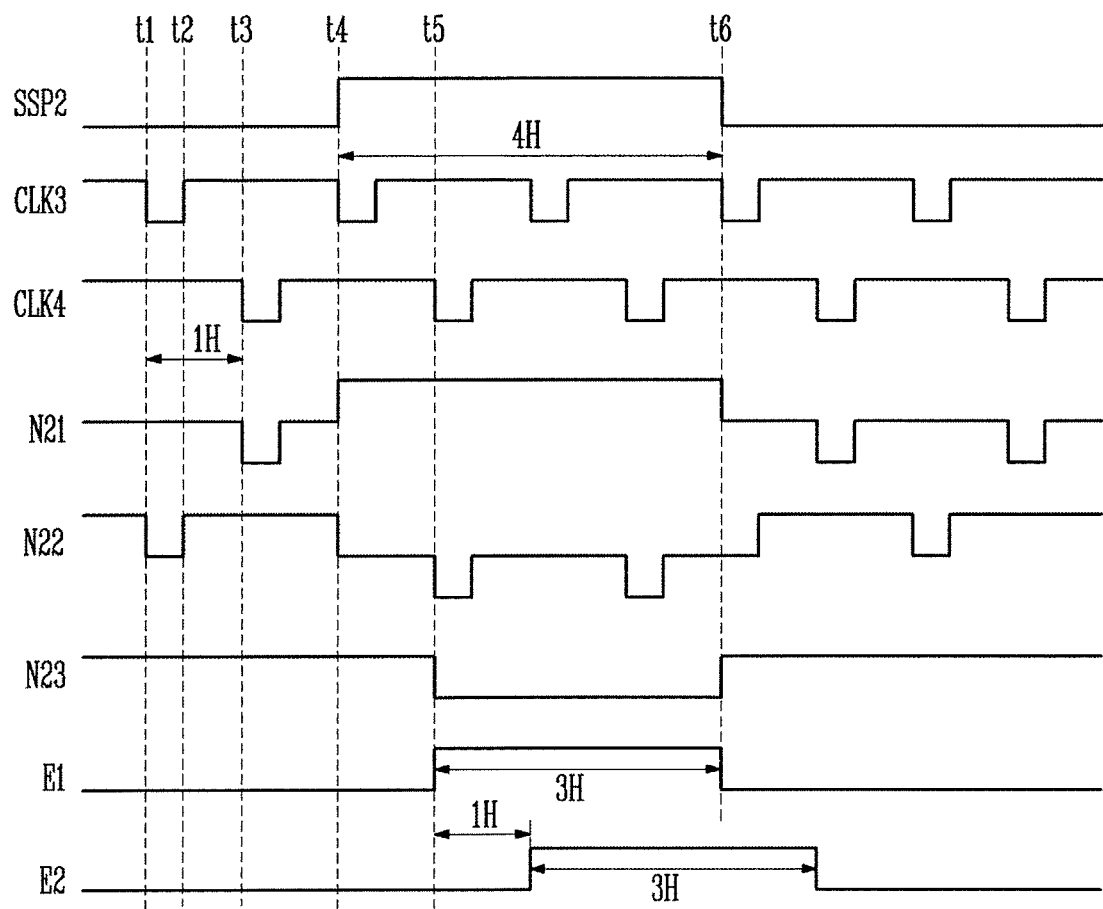
FIG. 11 illustrates an embodiment of a method for driving the light emission control stage.

FIG. 11 illustrates an embodiment of a method for driving the light emission control stage in FIG. 10. For convenience sake, FIG. 11 illustrates the operating process using the first light emission control stage EST1.

Referring to FIG. 11, the third clock signal CLK3 and the fourth clock signal CLK4 have a two (2) horizontal period (2 H) cycle and are supplied in different horizontal periods. For example, the fourth clock signal CLK4 is set to a signal shifted by as much as a half cycle (e.g., 1 horizontal period) from the third clock signal CLK3.

When the second start pulse SSP2 is supplied, the first input terminal 2001 may be set to the voltage of the third driving power source VDD1. When the second start pulse SSP2 is not supplied, the first input terminal 2001 may be set to the voltage of the fourth driving power source VSS1. Furthermore, when the clock signal CLK is supplied to the second input terminal 2002 and the third input terminal 2003, the second input terminal 2002 and the third input terminal 2003 may be set to the voltage of the fourth driving power source VSS1. When the clock signal CLK is not supplied, the second input terminal 2002 and the third input terminal 2003 may be set to the voltage of the third driving power source VDD1.

The second start pulse SSP2 supplied to the second input terminal 1002 may be supplied to be synchronized with the clock signal supplied to the second input terminal 2002, e.g., the third clock signal CLK3. Furthermore, the second start pulse SSP2 is set to have a greater width than the third clock signal CLK3. For example, the second start pulse SSP2 may be supplied for four (4) horizontal periods 4 H.

In the operation process, during a first time t1, the third clock signal CLK3 is supplied to the second input terminal 2002. When the third clock signal CLK3 is supplied to the second input terminal 2002, the eleventh transistor M11 and the thirteenth transistor M13 are turned on. When the eleventh transistor M11 is turned on, the first input terminal 2001 and the twenty-first node N21 are electrically connected. Since the second start pulse SSP2 is not supplied to the first input terminal 2001, a low voltage is supplied to the twenty-first node N21.

When the low voltage is supplied to the twenty-first node N21, the twelfth transistor M12, the eighteenth transistor M18 and the twentieth transistor M20 are turned on. When the eighteenth transistor M18 is turned on, the third driving power source VDD1 is supplied to the twenty-third node N23. Accordingly, the nineteenth transistor M19 is turned off. The thirteenth capacitor C13 charges a voltage corresponding to the third driving power source VDD1. Accordingly, even after the first time t1, the nineteenth transistor M19 stably maintains the turn-off state.

When the twentieth transistor M20 is turned on, the voltage of the fourth driving power source VSS1 is supplied to the output terminal 2004. Therefore, during the first time t1, a light emission control signal is not supplied to the first light emission control line E1.

When the twelfth transistor M12 is turned on, the third clock signal CLK3 is supplied to the twenty-second node N22. Furthermore, when the thirteenth transistor M13 is turned on, the voltage of the fourth driving power source VSS1 is supplied to the twenty-second node N22. The third clock signal CLK3 is set to the voltage of the fourth driving power source VSS1. Accordingly, the twenty-second node N22 is stably set to the voltage of the fourth driving power source VSS1. Meanwhile, when the voltage of the twenty-second node N22 is set to the fourth power source VSS1, the seventeenth transistor M17 is set to a turned off state. Therefore, irrespective of the twenty-second node N22, the twenty-third node N23 maintains the voltage of the third driving power source VDD1.

During a second time t2, the supply of the third clock signal CLK3 to the second input terminal 2002 stops. When the supply of the third clock signal CLK3 stops, the eleventh transistor M11 and the thirteenth transistor M13 are turned off. The voltage of the twenty-first node N21 maintains the low voltage by the eleventh capacitor C11. Accordingly, the twelfth transistor M12, the eighteenth transistor M18 and the twentieth transistor M20 maintain the turned on state.

When the twelfth transistor M12 is turned on, the second input terminal 2002 and the twenty-second node N22 are electrically connected. The twenty-second node N22 is set to a high voltage.

When the eighteenth transistor M18 is turned on, the voltage of the third driving power source VDD1 is supplied to the twenty-third node N23. Accordingly, the nineteenth transistor M19 maintains the turned off state.

When the twentieth transistor M20 is turned on, the voltage of the fourth driving power source VSS1 is supplied to the output terminal 2004.

During a third time t3, the fourth clock signal CLK4 is supplied to the third input terminal 2003. When the fourth clock signal CLK4 is supplied to the third input terminal 2003, the fourteenth transistor M14 and the seventeenth transistor M17 are turned on. When the seventeenth transistor M17 is turned on, the twelfth capacitor C12 and the twenty-third node N23 are electrically connected. The twenty-third node N23 maintains the voltage of the third driving power source VDD1. Furthermore, when the fourteenth transistor M14 is turned on, the fifteenth transistor M15 is set to a turned off state. Thus, even when the fourteenth transistor M14 is turned on, the voltage of the twenty-first node N21 does not change.

When the fourth clock signal CLK4 is supplied to the third input terminal 2003, the voltage of the twenty-first node N21 decreases to a lower voltage than the voltage of the fourth driving power source VS S1 by coupling of the eleventh capacitor C11. When the voltage of the twenty-first node N21 decreases to a lower voltage than the fourth driving power source VSS1, the driving characteristics of the eighteenth transistor M18 and the twentieth transistor M20 are improved (e.g., the lower the level of the voltage applied to a PMOS transistor, the better the driving characteristics of the PMOS transistor).

During a fourth time t4, the second start pulse SSP2 is supplied to the first input terminal 2001, and the third clock signal CLK3 is supplied to the second input terminal 2002. When the third clock signal CLK3 is supplied to the second input terminal 2002, the eleventh transistor M11 and the thirteenth transistor M13 are turned on. When the eleventh transistor M11 is turned on, the first input terminal 2001 and the twenty-first node N21 are electrically connected. Since the second start pulse SSP2 is supplied to the first input terminal 2001, a high voltage is supplied to the twenty-first node N21. When the high voltage is supplied to the twenty-first node N21, the twelfth transistor M12, the eighteenth transistor M18 and the twentieth transistor M20 are turned off.

When the thirteenth transistor M13 is turned on, the voltage of the fourth driving power source VSS1 is supplied to the twenty-second node N22. Since the fourteenth transistor M14 is set to a turned off state, the twenty-first node N21 maintains a high voltage. Furthermore, since the seventeenth transistor M17 is set to a turned off state, the voltage of the twenty-third node N23 maintains the high voltage by the thirteenth capacitor C13. Therefore, the nineteenth transistor M19 maintains the turned off state.

During a fifth time t5, the fourth clock signal CLK4 is supplied to the third input terminal 2003. When the fourth clock signal CLK4 is supplied to the third input terminal 2003, the fourteenth transistor M14 and the seventeenth transistor M17 are turned on. Since the voltage of the twenty-second node N22 is set to the voltage of the fourth driving power source VSS1, the fifteenth transistor M15 and the sixteenth transistor M16 are turned on.

When the sixteenth transistor M16 and the seventeenth transistor M7 are turned on, the fourth clock signal CLK4 is supplied to the twenty-third node N23. When the fourth clock signal CLK4 is supplied to the twenty-third node N23, the nineteenth transistor M19 is turned on. When the nineteenth transistor M19 is turned on, the voltage of the third driving power source VDD1 is supplied to the output terminal 2004. The voltage of the third driving power source VDD1 supplied to the output terminal 2004 is a light emission control signal supplied to the first light emission control line E1 on a first horizontal line.

When the voltage of the fourth clock signal CLK4 is supplied to the twenty-third node N23, the voltage of the twenty-second node N22 decreases to a lower voltage than the voltage of the fourth driving power source VSS1, by coupling of the twelfth capacitor C12. Accordingly, the driving characteristics of the transistors connected to the twenty-second node N22 may be improved.

When the fourteenth transistor M14 and the fifteenth transistor M15 are turned on, the voltage of the third driving power source VDD1 is supplied to the twenty-first node N21. As the voltage of the third driving power source VDD1 is supplied to the twenty-first node N21, the twentieth transistor M20 maintains the turned off state. Therefore, the voltage of the third driving power source VDD1 may be stably supplied to the first light emission control line E1.

During a sixth time t6, the third clock signal CLK3 is supplied to the second input terminal 2002. When the third clock signal CLK3 is supplied to the second input terminal 2002, the eleventh transistor M11 and the thirteenth transistor M13 are turned on. When the eleventh transistor M11 is turned on, the twenty-first node N21 and the first input terminal 2001 are electrically connected. Accordingly, the voltage of the twenty-first node N21 is set to a low voltage.

When the voltage of the twenty-first node N21 is set to the low voltage, the eighteenth transistor M18 and the twentieth transistor M20 are turned on.

When the eighteenth transistor M18 is turned on, the voltage of the third driving power source VDD1 is supplied to the twenty-third node N23. Accordingly, the nineteenth transistor M19 is turned off. When the twentieth transistor M20 is turned on, the voltage of the fourth driving power source VSS1 is supplied to the output terminal 2004. The voltage of the fourth driving power source VSS1 supplied to the output terminal 2004 is supplied to the first light emission control line E1. Accordingly, the supply of the light emission control signal stops.

The light emission control stages EST according to the present embodiment may output the light emission control signals to the light emitting lines sequentially as the aforementioned process is repeated. In the embodiment in FIGS. 5 to 11, the transistors are PMOS transistors. The transistors may be NMOS transistors in another embodiment.

Figure 12:
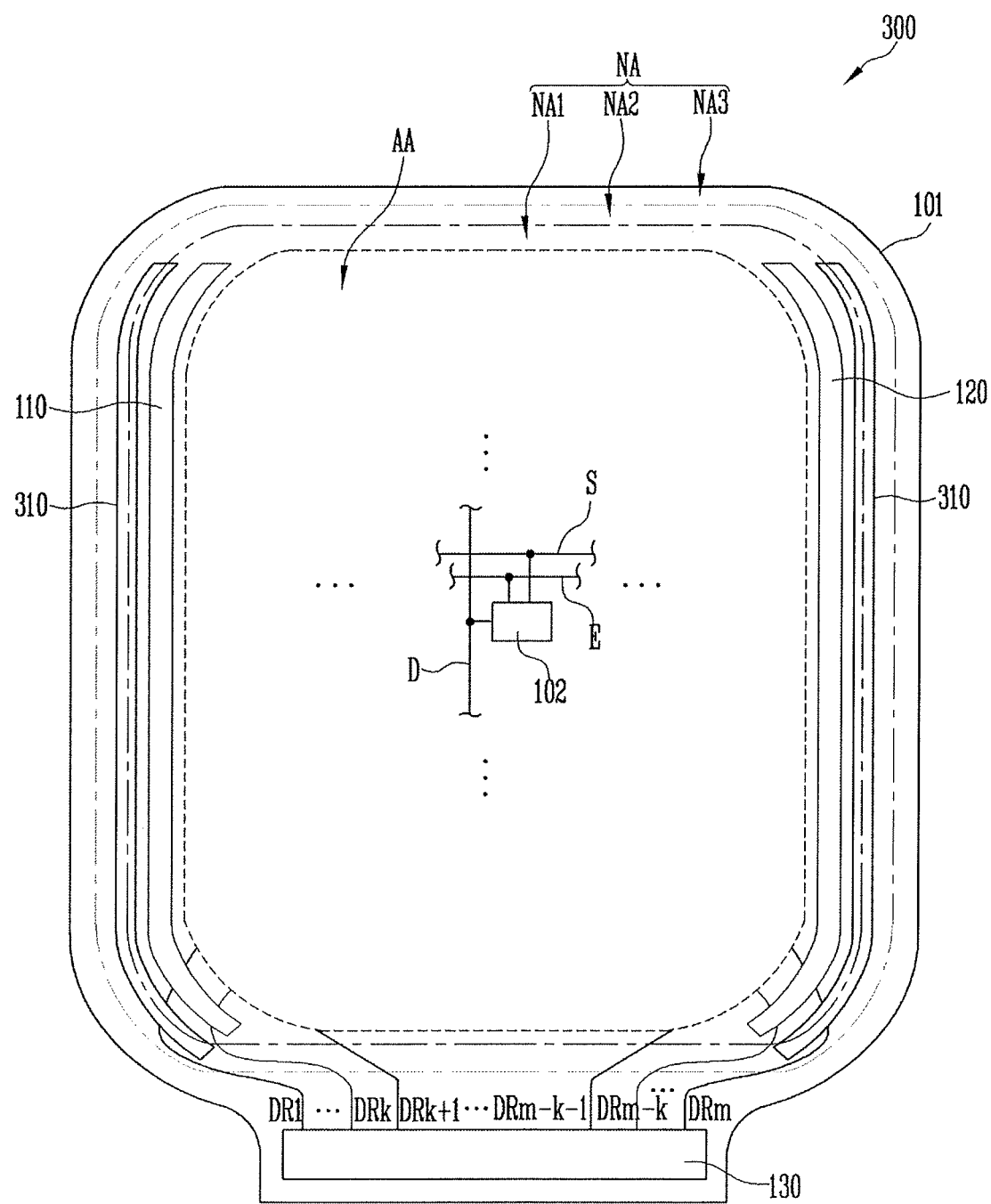
FIG. 12 illustrates another embodiment of a display device.

FIG. 12 illustrates another embodiment of a display device 300 which includes at least one power source wire 310 arranged on the outskirts of the first and/or second internal circuit portion 110, 120. For example, the power source wire 310 may be a first or second power source line for supplying a first or second power source ELVDD, ELVSS to the pixel area AA.

Depending on embodiments, the first power source line may be arranged on different sides or on only one side of the pixel area AA. Furthermore, the second power source line may be separated from the first power source line and be arranged on different sides of the pixel area AA or on only one side of the pixel area AA.

Depending on embodiments, the power source wire 310 may be arranged in the first non-pixel area NA1 with the first and/or second internal circuit portion 110, 120. Otherwise, depending on embodiments, the power source wire 310 may be arranged in the second non-pixel area NA2 or on a boundary between the first non-pixel area NA1 and the second non-pixel area NA2. According to an embodiment, at least a portion of the power source wire 310 may be provided between the first and/or second internal circuit portion 110, 120 and an edge portion (or a corner portion) of the display device 300.

The power source wire 310 is connected to one or more power source connecting lines. Depending on embodiments, the one or more power source connecting lines may be arranged to traverse between the stages in the first and/or second internal circuit portion 110, 120. Otherwise, depending on embodiments, the power source connecting line may be arranged on a layer different from the circuit elements in the first and/or second internal circuit portion 110, 120, with at least one insulating layer therebetween. The power source wire 310 may be connected to a pad portion via a power source supply line. The power source wire 310 may be provided with a certain power source from an external power source supply circuit.

Depending on embodiments, the power source wire 310 may have at least one end rounded in a curve form corresponding to the shape of the pixel area AA as in the first and/or second internal circuit portion 110, 120.

Figure 13:
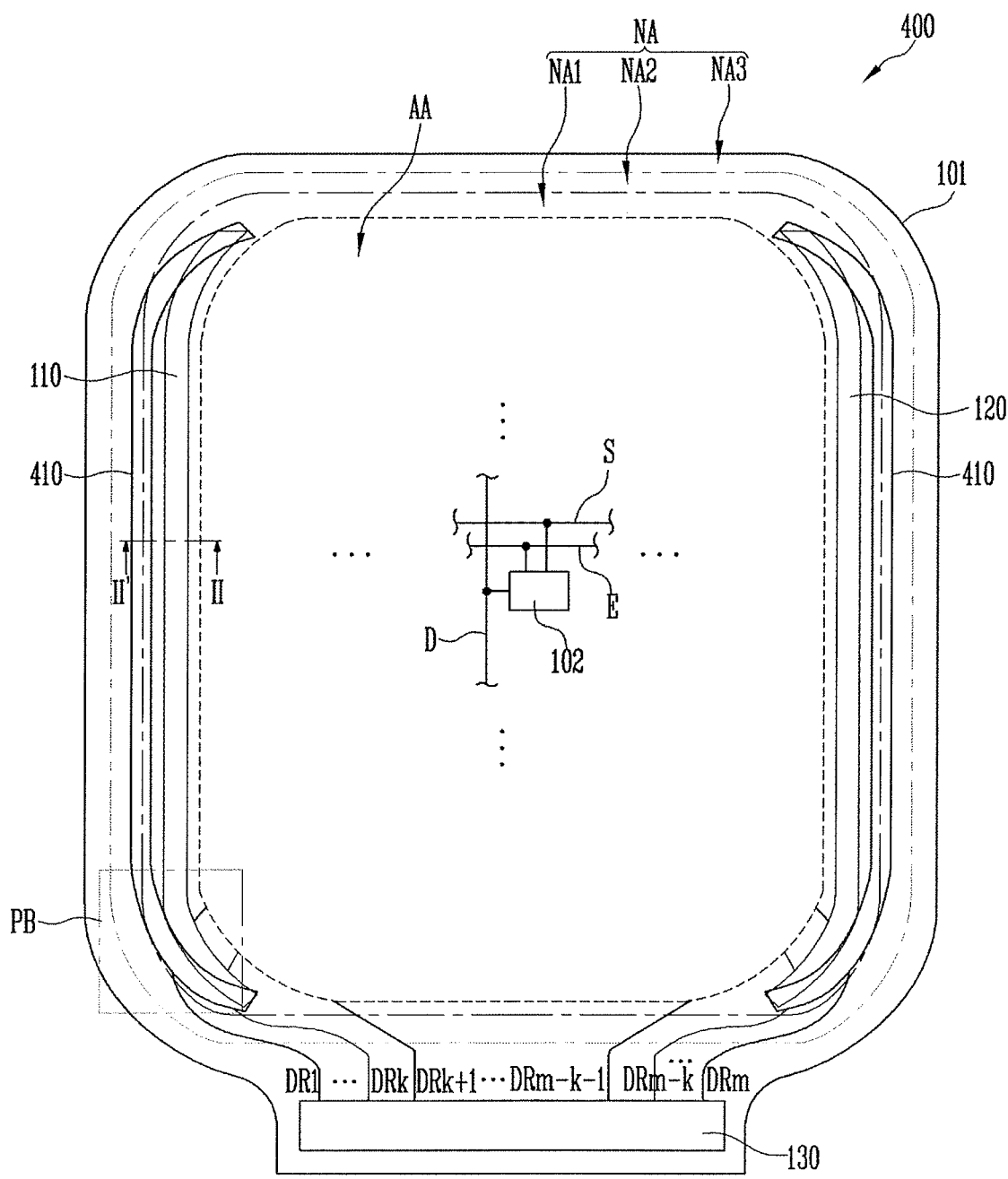
FIG. 13 illustrates another embodiment of a display device.

FIG. 13 illustrates another embodiment of a display device 400 which includes at least one power source wire or line 410 overlapping an adjacent internal circuit portion, e.g., the first or second internal circuit portion 110, 120. For example, at least one area of the power source wire 410 may be superimposed on the first end portion of the adjacent first or second internal circuit portion 110, 120. The power source wire 410 may be designed, for example, such that at least one area adjacent to the rounded first corner portion of the pixel area AA is superimposed on the rounded first end portion of the first or second internal circuit portion 110, 120.

When the power source wire 410 and the first or second internal circuit portion 110, 120 are superimposed in this manner, the power source wire 410 may secure the quality of insulation against the circuit element in the first or second internal circuit portion 110, 120. For example, the power source wire 410 may include one or more conductive layers on a layer different from the layer where the circuit element in the first or second internal circuit portion 110, 120 superimposed thereon is formed. Otherwise, in the area superimposed with at least the first or second internal circuit portion 110, 120, the power source wire 410 may be embodied as a connecting wire that traverses between the stages of the first or second internal circuit portion 110, 120.

As previously mentioned, at least one area of the power source wire 410 (e.g., one area adjacent to the rounded corner portion of the display device 400) may be superimposed with the first or second internal circuit portion 110, 120. Accordingly, the corner portion dead space of the display device 400 may be reduced.

Figure 14:
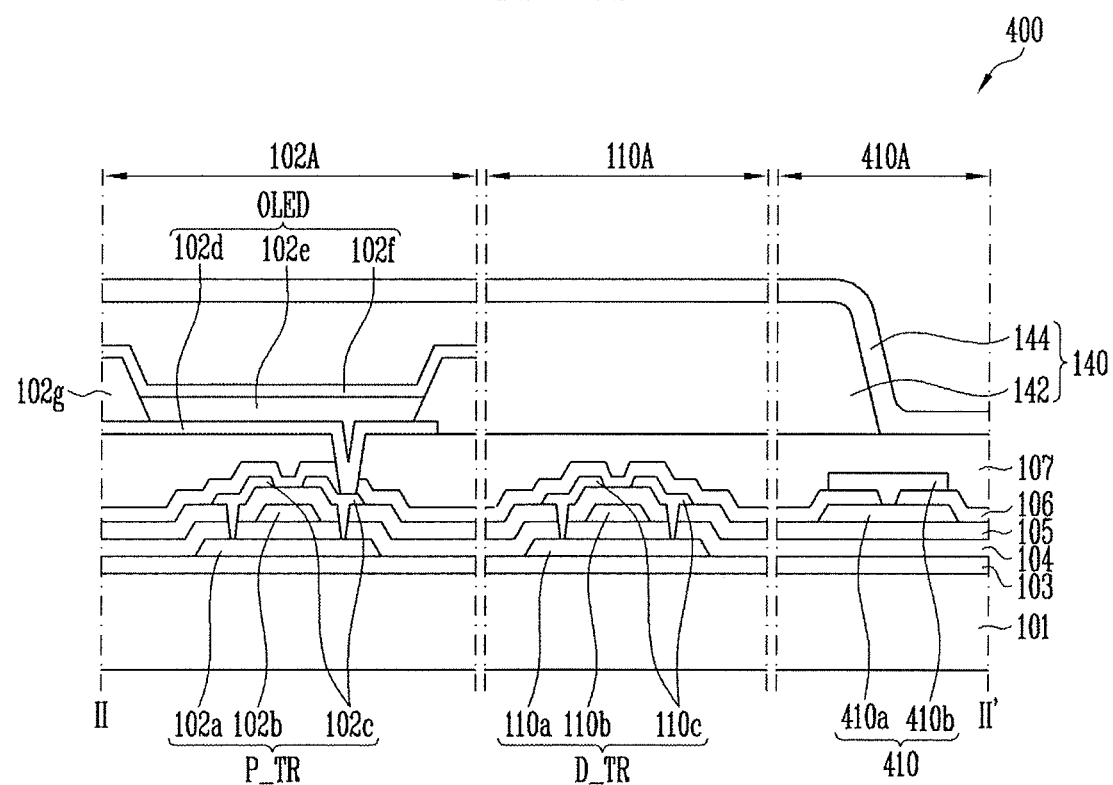
FIG. 14 illustrates a view taken along section line II-IF in FIG. 13.

FIG. 14 illustrates an embodiment of a cross-section taken along line II-IF of FIG. 13. Referring to FIG. 14, each pixel area 102A includes a pixel transistor P_TR and an organic light emitting diode OLED electrically connected to the pixel transistor P_TR. An internal circuit portion area 110A includes a driver transistor D_TR, and a power source wire area 410A includes a power source wire 410. The pixel transistor P_TR and the driver transistor D_TR are on a buffer layer 103 formed on the substrate 101. The buffer layer 103 may be omitted.

The pixel transistor P_TR includes a semiconductor layer 102a, a gate electrode 102b, and source and drain electrodes 102c. A first insulating layer 104 (for example, gate insulating layer) is between the semiconductor layer 102a and the gate electrode 102b. A second insulating layer 105 (for example, a first interlayer insulating layer) is between the gate electrode 102b and the source and drain electrodes 102c. A third insulating layer 106 (for example, a second interlayer insulating layer) is provided on the source and drain electrodes 102c. A passivation layer 107 is provided on an upper portion of the third insulating layer 106. The pixel transistor P_TR is electrically connected to the organic light emitting diode OLED through a via hole (or contact hole) penetrating the third insulating layer 106 and the passivation layer 107.

The organic light emitting diode OLED includes a first electrode 102d (for example, anode electrode) on the passivation layer 107, a light emission layer 102e on the first electrode 102d, and a second electrode 102f (for example, cathode electrode) on the light emitting layer 102e. An encapsulating layer 140, including a first encapsulating layer 142 and a second encapsulating layer 144, is formed on the upper portion of such an organic light emitting diode OLED. Reference numeral 102g is a pixel defining layer.

The driver transistor D_TR includes the semiconductor layer 110a, the gate electrode 110b and the source and drain electrode 110c. The first insulating layer 104 is between the semiconductor layer 110a and the gate electrode 110b. The second insulating layer 105 is between the gate electrode 110b and the source and drain electrode 110c. The third insulating layer 106 and the passivation layer 107 are formed on an upper portion of such a driver transistor D_TR. An encapsulating layer 140, including a first encapsulating layer 142 and a second encapsulating layer 144, is formed on an upper portion of the third insulating layer 106 and the passivation layer 107.

According to an embodiment, the power source wire 410 may have a double-layered structure which includes a first conductive layer 410a and a second conductive layer 410b electrically connected to the first conductive layer 410a. The first conductive layer 410a may constitute a first wire, and the second conductive layer 410b may constitute a second wire. In other words, the power source wire 410 may have a multi-layered structure including the first and second wires electrically connected to each other. When the power source wire 410 is in a double-layered structure, resistance of the wire may be reduced, thereby preventing screen degradation caused by RC delay.

The third insulating layer 106 is between the first conductive layer 410a and the second conductive layer 410b. The first conductive layer 410a and the second conductive layer 410b may be electrically connected to each other through a contact hole in the third insulating layer 106.

Depending on embodiments, the first conductive layer 410a may be formed on a same layer (for example, first source drain layer) as an electrode of the driver transistor D_TR and/or an electrode of the pixel transistor P_TR. For example, the first conductive layer 410a may be on a same layer as the source and drain electrodes 102c, 110c on the uppermost layer of the electrodes constituting the driver transistor D_TR and the pixel transistor P_TR. Furthermore, the second conductive layer 410b is on the first conductive layer 410a having one or more insulating layers, for example, the third insulating layer 106 therebetween. For example, the second conductive layer 410b may be on a second source drain layer arranged on a further upper portion of the first source drain layer. The second conductive layer 410b may be disposed on a layer between a layer on which the first electrode 102d is disposed and a layer on which the first conductive layer 410a is disposed. For example, when the first electrode 102d is on a first layer and the first conductive layer 410a is on a second layer, the second conductive layer 410b is on a third layer between the first layer and the second layer.

FIG. 14 illustrates an embodiment where the first encapsulating layer 142 is formed on only one area of the power source wire 410. The arrangement relationship between the power source wire 410 and the first encapsulating layer 142 may be different in other embodiments. In the display device 400, the power source wire 410 includes at least one second conductive layer 410b on a layer different from the layer where the circuit element, for example, the driver transistor D_TR in the internal circuit portion area 110A is formed. Thus, when at least one area of the power source wire 410 is superimposed on the first or second internal circuit portion 110, 120 for reducing the dead space, the power source wire 410 and the first or second internal circuit portion 110, 120 may be designed to secure electrical stability (insulation properties) therebetween.

According to an embodiment, the power source wire 410 may be a first power source line for supplying the first power source ELVDD to the pixels 102. In this case, the power source wire 410 may be electrically connected to the first electrode 102d via the pixel transistor P_TR. According to another embodiment, the power source wire 410 may be a second power source line for supplying the second power source ELVSS to the pixels 102. In this case, the power source wire 410 may be electrically connected to the second electrode 102f.

Figure 15:
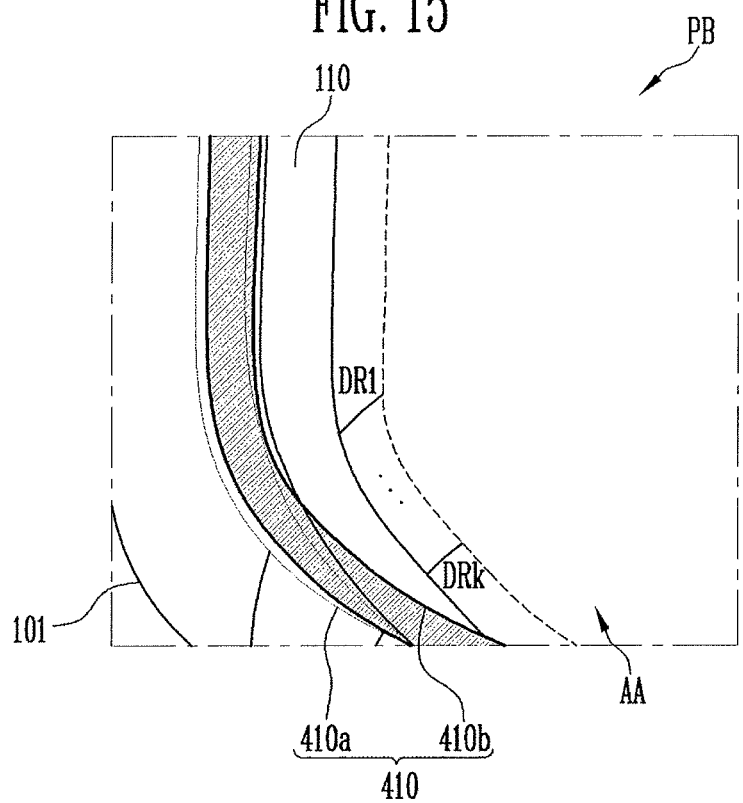
FIG. 15 illustrates an embodiment of an area of the display device in FIG. 13.

FIG. 15 illustrates an embodiment of one area (PB area) of the display device in FIG. 13. Referring to FIG. 15, the power source wire 410 includes the first conductive layer 410a and the second conductive layer 410b. One area of such a power source wire 410 is superimposed, for example, on the first end portion (for example, lower end portion) of the first internal circuit portion 110.

The first conductive layer 410a, arranged on a same layer as the circuit element in the first internal circuit portion 110, has a width that decreases and becomes thinner as in a direction approaching the corner portion adjacent to the first end portion, such that it is not superimposed on the first end portion of the first internal circuit portion 110. For example, the width of the first conductive layer 410a decreases with increasing proximity to the corner portion, where the width of the area where the power source line 410 is superimposed with the first internal circuit portion 110 increases.

The first conductive layer 410a may be on a remainder of the area, except the area where the power source wire 410 is superimposed with the first internal circuit portion 110. This may prevent a short defect from forming between the power source wire 410 and the first internal circuit portion 110.

On the other hand, at least one area of the second conductive layer 410b on a layer different from the layer where the circuit element in the first internal circuit portion 110 is formed, with one or more insulating layer therebetween, may be superimposed on the first end portion of the first internal circuit portion 110.

As in the aforementioned embodiment, by superimposing at least one area of the power source wire 410 (e.g. the area adjacent to the corner portion of the display device 400 on the first internal circuit portion 110), dead space of the non-pixel area NA may be substantially reduced.

Figure 16:
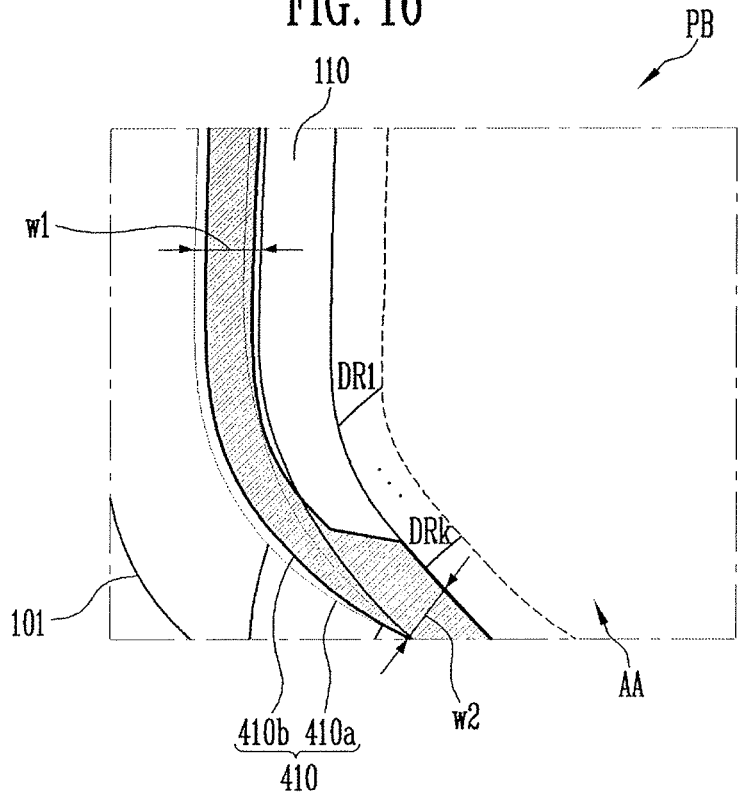
FIG. 16 illustrates another embodiment of the area of the display device in FIG. 13.

FIG. 16 illustrates another embodiment of the one area (PB area) of the display device in FIG. 13. Referring to FIG. 16, the width of the second conductive layer 410b of the power source wire 410 may expand in the area superimposed with the first internal circuit portion 110. For example, the width of the second conductive layer 410b (for example, second width w2) in the area superimposed with the first internal circuit portion 110 may be greater than its width (for example, first width w1) in a remainder of the area that is not superimposed with the first internal circuit portion 110. For example, the second width w2 may be set to be about two times or more than the first width w1.

As previously mentioned, when the width of the second conductive layer 410b is expanded in the area superimposed with the first internal circuit portion 110, the resistance increase may be compensated due to removal of the first conductive layer 401a from the superimposed area. Accordingly, the resistance value of the power source wire 410 may be maintained at a constant or substantially constant value.

Figure 17:
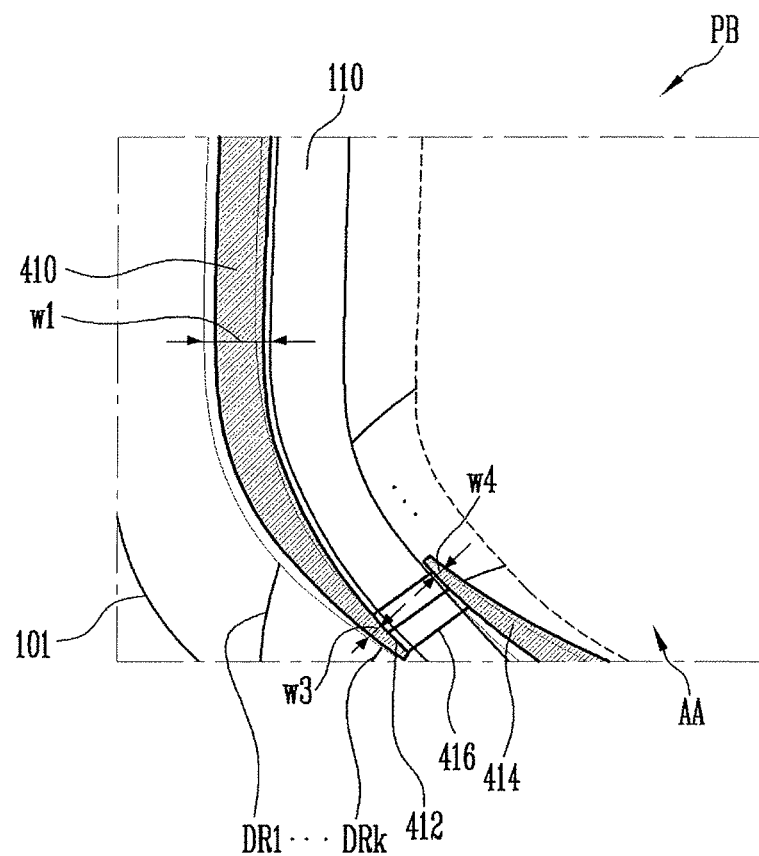
FIG. 17 illustrates another embodiment of the area of the display device in FIG. 13.

FIG. 17 illustrates another embodiment of the one area (PB area) of the display device in FIG. 13. Referring to FIG. 17, the power source wire 410 branches into at least two sub power source lines 412, 414 (e.g., a first sub power source line 412 and a second sub power source line 414), with the first end portion therebetween, in the area adjacent to the first end portion (one end portion in the rounded corner portion of the display device) of the first internal circuit portion 110.

Each of the first sub power line 412 and the second sub power source line 414 is on an outer side and an inner side of the first internal circuit portion 110. For example, the first sub power source line 412 may be arranged to neighbor the outer circumference of the first end portion of the first internal circuit portion 110. The second sub power source line 414 may be arranged to neighbor the inner circumference of the first end portion. Depending on embodiments, the first and/or second sub power source line 412, 414 may be superimposed on at least one routing wire DR.

Depending on embodiments, in an area where the first sub power source line 412 and the second sub power source line 414 face each other having the internal circuit portion 110 therebetween, a sum of widths (w3+w4) of the first sub power source line 412 and the second sub power source line 414 may be set substantially the same as the first width w1 in the rest of the areas (non-branched area) of the power source wire 410. Substantially the same widths may mean that the widths are the same or are similar to within a certain error range. Accordingly, it is possible to maintain a constant (or, substantially constant) resistance value of the power source wire 410 (e.g., uniform resistance value).

For this purpose, the width of the first sub power source line 412 may decrease in a direction approaching the rounded corner portion of the display device 400. The width of the second sub power source line 414 may increase in a direction approaching the rounded corner portion of the display device 400.

The first sub power source line 412 and/or the second sub power source line 414 may have a single-layered structure or in a multiple-layered structure. For example, both the first and second sub power source lines 412, 414 may have a multiple-layered structure that includes the first conductive layer 410a and the second conductive layer 410b as previously explained. In this case, the routing wires DR may be formed on a different layer from the first conductive layer 410a and the second conductive layer 410b, with one or more insulating layers therebetween. The routing wires DR may be, for example, on a gate layer.

When the routing wires DR are on the same layer as the first or second conductive layer 410a, 410b, the conductive layer (that is, the first or second conductive layer 410a, 410b) on the same layer as the routing wires DR may be partially removed in the area where the first sub power source line 412 and/or the second sub power source line 414 are superimposed on the routing wires DR.

The power source wire 410 may include a connecting line 416 for electrically connecting the first sub power source line 412 and the second sub power source line 414.

Depending on embodiments, the connecting line 416 may traverse the area between the plurality of stages in the first internal circuit portion 110 and connect the first sub power source line 412 and the second sub power source line 414. In this case, the connecting line 416 may be formed by the first and/or second conductive layer 410a, 410b. For example, the connecting line 416 may be on the first source drain layer integrally with the first conductive layer 410a or on the second source drain layer integrally with the second conductive layer 410b.

When the connecting line 416 is realized as the second conductive layer 410b on the second source drain layer, the connecting line 416 is on a different layer from the driver transistor (e.g., D_TR in FIG. 14) in the first internal circuit portion, with at least one insulating layer therebetween. In this case, even if the connecting line 416 is superimposed on at least one stage in the first internal circuit portion 110, a short defect between the power source wire 410 and the first internal circuit portion 110 may be prevented.

Figure 18:
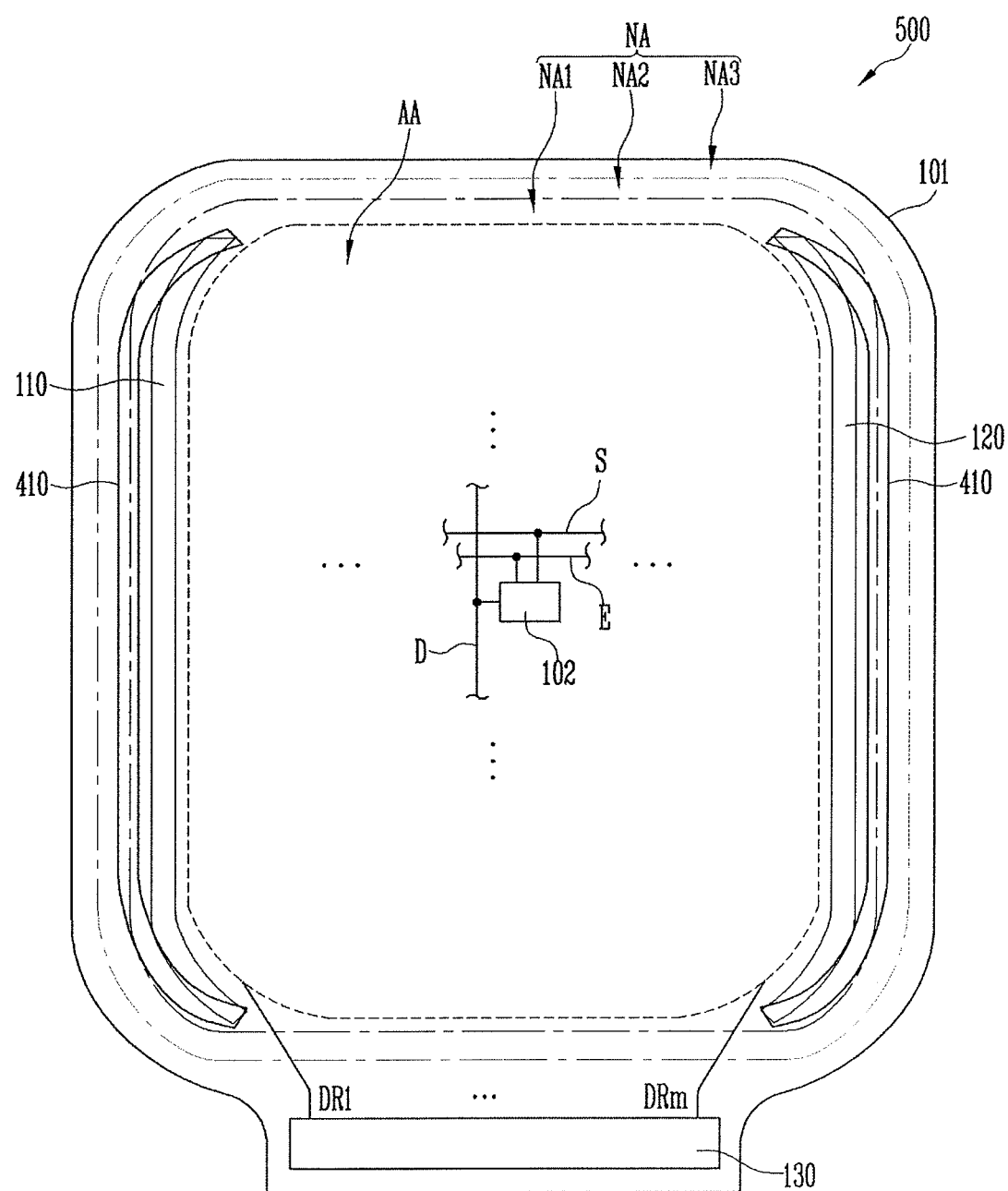
FIG. 18 illustrates another embodiment of a display device.

FIG. 18 illustrates another embodiment of a display device 500. Referring to FIG. 18, of the aforementioned embodiments, the embodiments where the dead space is reduced by superimposing the power source wire 410 on the first or second internal circuit portion 110, 120 adjacent thereto in at least one area (for example, corner portion of the display device) may be applied irrespective of the arrangement structure of the routing wires DR. For example, the embodiments in FIGS. 13 to 17 may also be applied to the display device 500, where the routing wires DR are routed in a general fan-out form as illustrated in FIG. 18.

Dead space in a display apparatus may be substantially reduced by selectively applying the embodiments in FIGS. 1 to 18 or a combination of these embodiments.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of embodiments set forth in the claims.

What is claimed is:

1. A display device, comprising:
  a substrate including a pixel area with at least a first rounded corner portion and a non-pixel area arranged sequentially along an outer circumference of the pixel area;
  a plurality of pixels in the pixel area, at least one of the pixels comprising:
    a transistor on the substrate, the transistor having a semiconductor layer, a gate electrode, and source and drain electrodes;
    a first electrode on a first layer on the transistor;
    a light emission layer on the first electrode; and
    a second electrode on the light emission layer;
  an internal circuit in the non-pixel area and having a first end portion adjacent to the first rounded corner portion of the pixel area;
  a plurality of routing wires in the non-pixel area below the pixel area, the routing wires extending to the pixel area from the non-pixel area; and
  a power source wire in the non-pixel area, provided between the internal circuit and an edge of the display device,
  wherein, the power source wire branches into at least a first sub power source line and a second sub power source line in an area adjacent to the first end portion of the internal circuit, and
  wherein the first end portion is between the first and second sub power source lines.

2. The display device as claimed in claim 1, wherein the routing wires includes at least a first routing wire connected to the pixel area passing an area of the first end portion of the internal circuit.

3. The display device as claimed in claim 2, wherein the internal circuit includes a plurality of stages to sequentially output a control signal.

4. The display device as claimed in claim 3, wherein the first routing wire traverses an area between adjacent ones of the stages and is connected to the pixels in a first column.

5. The display device as claimed in claim 2, wherein the power source wire comprises:
  a first conductive layer on a second layer, and
  a second conductive layer on the first conductive layer, the second conductive layer electrically connected to the first conductive layer, wherein the second conductive layer is provided on a third layer between the first layer and the second layer.

6. The display device as claimed in claim 5, wherein:
the first sub power source line neighbors an outer circumference of the first end portion, and
the second sub power source line neighbors an inner circumference of the first end portion.

7. The display device as claimed in claim 5, wherein the power source wire includes a connecting line connecting the first sub power source line and the second sub power source line.

8. The display device as claimed in claim 7, wherein the connecting line traverses an area between a plurality of stages in the internal circuit and electrically connects the first sub power source line and the second sub power source line.

9. The display device as claimed in claim 7, wherein the connecting line includes a conductive layer on a different layer from a transistor in the internal circuit.

10. The display device as claimed in claim 7, wherein a sum of widths of the first and second sub power source lines in an area where the first and second sub power source lines face each other, with the first end portion therebetween, has a width substantially equal to the power source wire in a non-branch area.

11. The display device as claimed in claim 1, wherein the power source wire is electrically connected to the first electrode or the second electrode.

12. The display device as claimed in claim 5, wherein the routing wires are on different layer from the first conductive layer and the second conductive layer.

13. The display device as claimed in claim 12, wherein the second layer is interposed between the routing wires and the first conductive layer.

14. The display device as claimed in claim 12, wherein the routing wires are on same layer as the first conductive layer or the second conductive layer.

15. The display device as claimed in claim 14, wherein:
the first conductive layer is partially removed in the area where the first sub power source line and/or the second sub power source line are superimposed on the routing wires when the routing wires are on the same layer as the first conductive layer, and
the second conductive layer is partially removed in the area where the first sub power source line and/or the second sub power source line are superimposed on the routing wires when the routing wires are on the same layer as the second conductive layer.

* * * * *